United States Patent
Teng et al.

(10) Patent No.: US 10,325,919 B1
(45) Date of Patent: Jun. 18, 2019

(54) MASK DESIGN FOR EMBEDDED MEMORY

(71) Applicant: Taiwan Semiconductor Manufacturing Co., Ltd., Hsin-Chu (TW)

(72) Inventors: Li-Feng Teng, Hsinchu (TW); Wei Cheng Wu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/015,480

(22) Filed: Jun. 22, 2018

(51) Int. Cl.
| | |
|---|---|
| *H01L 27/115* | (2017.01) |
| *H01L 27/11546* | (2017.01) |
| *H01L 27/11529* | (2017.01) |
| *H01L 27/11524* | (2017.01) |

(52) U.S. Cl.
CPC .. *H01L 27/11546* (2013.01); *H01L 27/11524* (2013.01); *H01L 27/11529* (2013.01)

(58) Field of Classification Search
None
See application file for complete search history.

(56) References Cited

U.S. PATENT DOCUMENTS

| | | | | |
|---|---|---|---|---|
| 10,128,259 B1 * | 11/2018 | Yang | ................ | H01L 27/11568 |
| 2008/0145985 A1 * | 6/2008 | Chi | ................ | B82Y 10/00 |
| | | | | 438/199 |
| 2013/0334584 A1 * | 12/2013 | Tang | ................ | H01L 27/11546 |
| | | | | 257/315 |
| 2017/0194335 A1 * | 7/2017 | Wu | ................ | H01L 27/1157 |
| 2017/0194344 A1 * | 7/2017 | Wu | ................ | H01L 27/11582 |

* cited by examiner

*Primary Examiner* — Minh Loan Tran
(74) *Attorney, Agent, or Firm* — Eschweiler & Potashnik, LLC

(57) ABSTRACT

Various embodiments of the present application are directed to a method for forming an integrated circuit (IC), and the associated integrated circuit. In some embodiments, a stack of gate dielectric precursor layers is formed on a plurality of logic sub-region and is then selectively removed from at least two logic sub-regions. Then, a gate dielectric precursor layer is formed, and a plasma treatment process and an annealing process are subsequently performed. The gate dielectric precursor layer is then selectively removed from a low-voltage logic sub-region, but not a high-voltage logic sub-region. By removing the stack of gate dielectric precursor layers from the low-voltage logic sub-region prior to performing the plasma treatment process and the annealing process, less gate dielectric precursor material is treated, annealed, and removed from the low-voltage logic sub-region. Thus, the resulting residues are reduced, and the defects introduced by the residues are also reduced or eliminated.

20 Claims, 13 Drawing Sheets

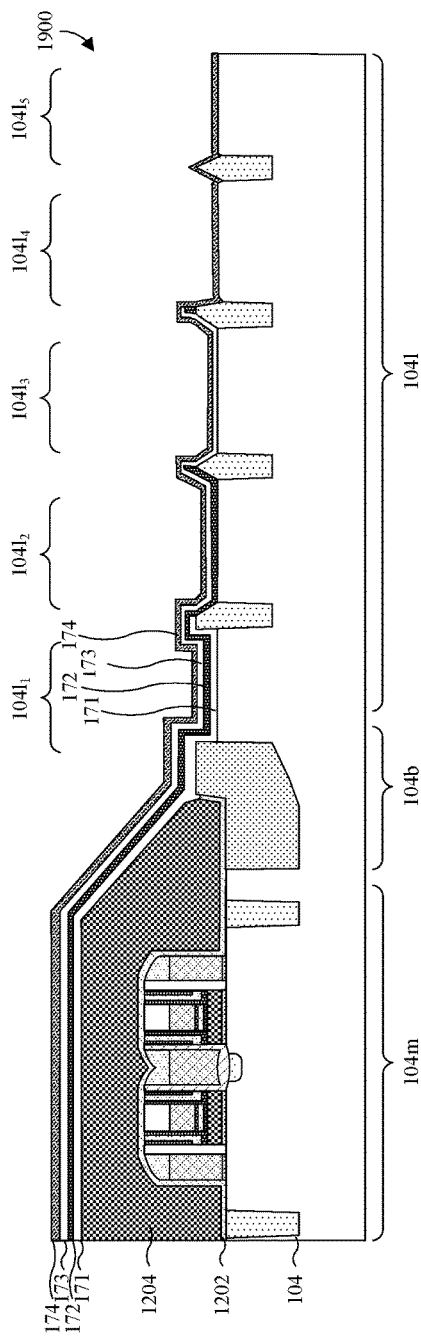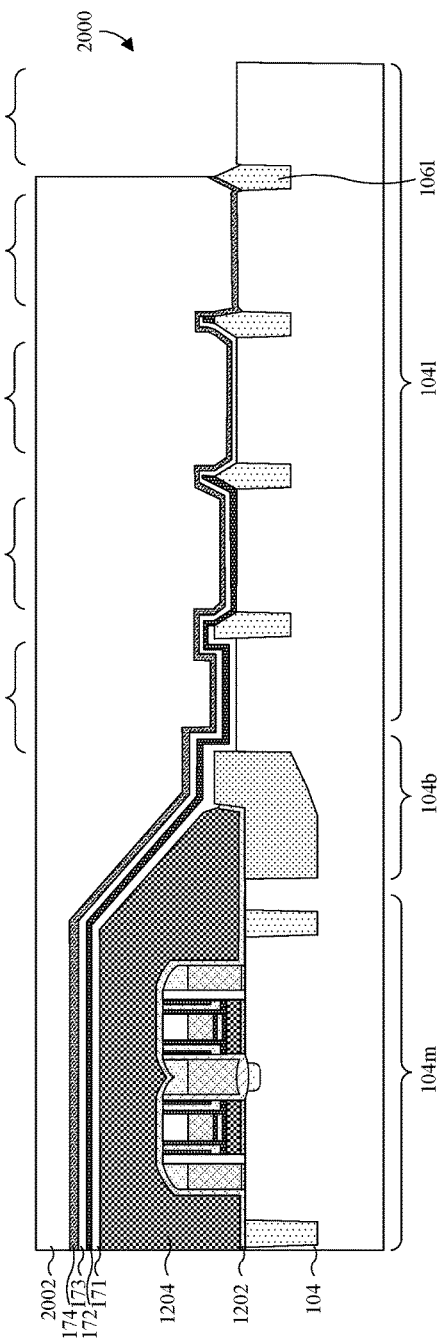

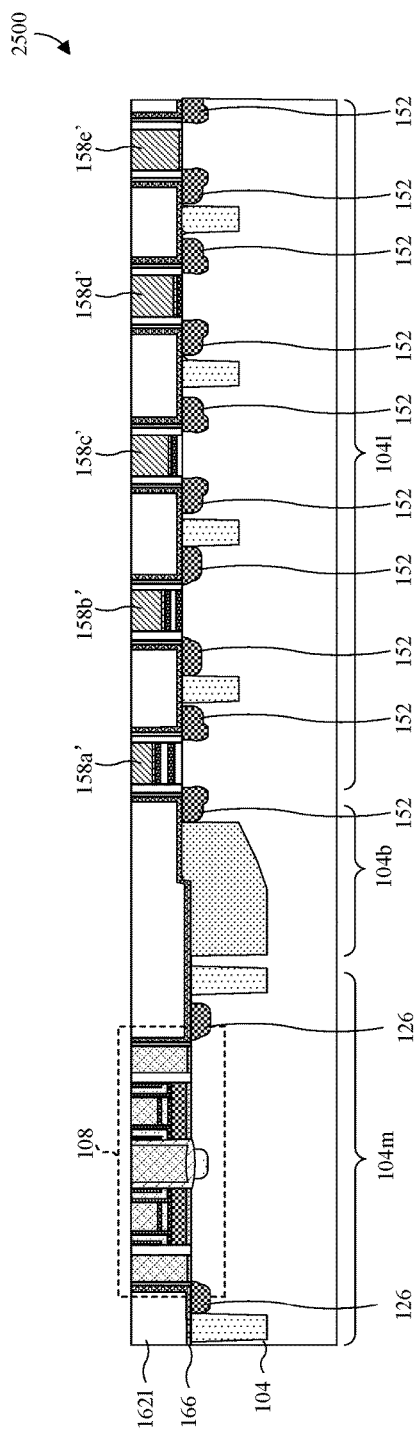
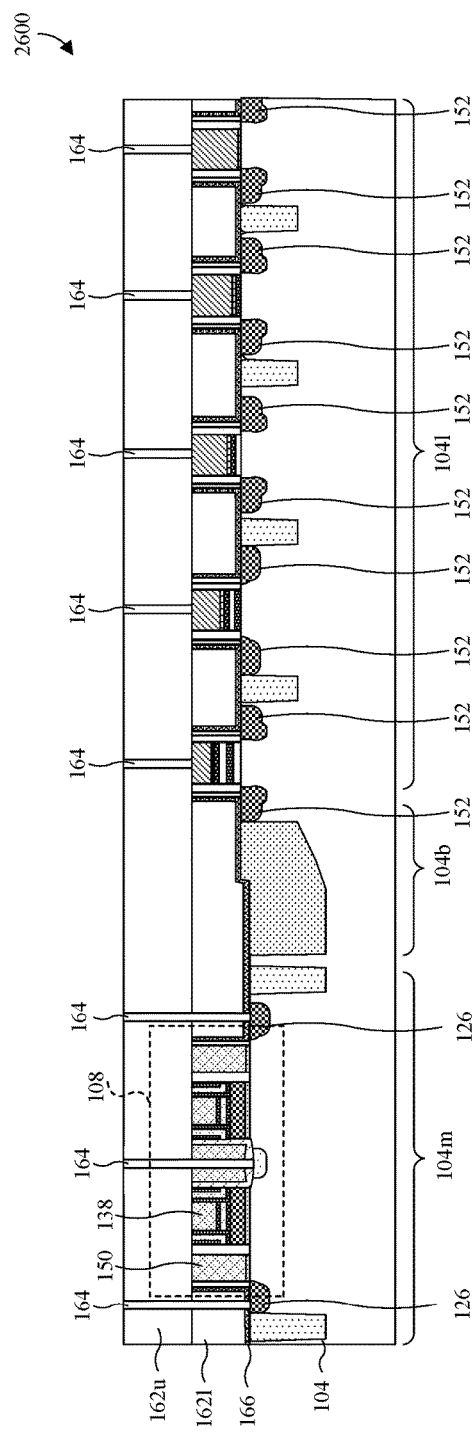
Fig. 25
Fig. 26

MASK DESIGN FOR EMBEDDED MEMORY

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component (or line) that can be created) has decreased. Some advancements in the evolution of ICs include embedded memory technology. Embedded memory technology is the integration of memory devices with logic devices on the same semiconductor chip, such that the memory devices support the operation of the logic devices. An embedded memory IC includes a plurality of logic devices operating at different voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7-26 illustrate a series of cross-sectional views of some embodiments of a method for forming an IC comprising a plurality of logic devices operating at different voltages.

DETAILED DESCRIPTION

Figure 1:
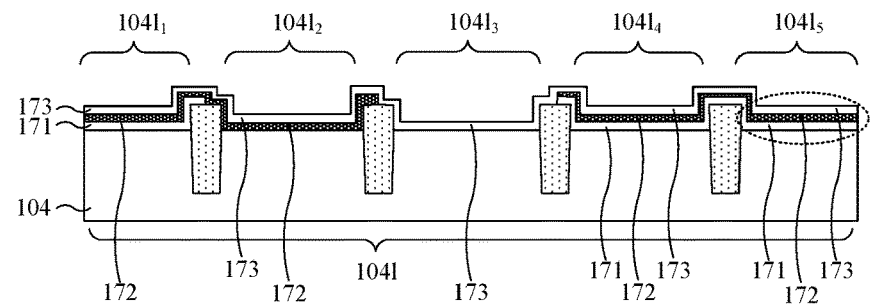
FIGS. 1-4 illustrate a series of cross-sectional views of some embodiments of a method for forming an embedded memory integrated circuit (IC).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

Embedded memory is a non-stand-alone memory, which is integrated on the same chip as a logic core and which supports the logic core to accomplish an intended function. In an embedded memory IC, a plurality of different logic devices may respectively be on a plurality of logic sub-regions and operate at different voltage levels. For example, a first logic device may be on a first logic sub-region, may be used to drive memory cells, and may have a relatively high operating voltage level (e.g., greater than 10V). A second logic device may be on a second logic sub-region, may be a medium voltage device (e.g., an RF (radio frequency) device or a MIM (metal-insulator-metal) device), and may have an operating voltage level smaller than the high voltage device (e.g., around 5V). A third logic device may be on a third logic sub-region, may be an I/O (input and output) device, and may have an operating voltage level smaller than the second logic device (e.g. around 1.5V to 3V). A fourth logic device may be on a fourth logic sub-region, may be a word line device, and may have an operating voltage level smaller than the third logic device (e.g. around 1V to 2V). A fifth logic device may be on a fifth logic sub-region, may be a core device, and may have an operating voltage level smaller than the fourth logic device (e.g. smaller than 1.5V). In order to handle the relatively high operating voltage level, the high voltage device has a gate dielectric with a greater thickness. The core logic device, on the other hand, has a gate dielectric with a smaller thickness. One method to form gate dielectrics for corresponding logic devices includes forming and patterning a stack of oxide layers in succession on the plurality of logic sub-regions. A first oxide layer is formed covering all logic sub-regions and is then patterned to selectively remove the first oxide layer from the second logic sub-region. Then, a second oxide layer is formed covering all logic sub-regions and is then patterned with the first oxide layer to selectively remove the first and second oxide layer from the third logic sub-region. In the same manner, a third oxide layer is formed covering all logic sub-regions and is then patterned with the first and second oxide layers to selectively remove the first, second, and third oxide layers from the fourth logic sub-region. Still in the same manner, a fourth oxide layer is formed covering all logic sub-regions and is then patterned to selectively remove the first, second, third, and fourth oxide layers from the fifth logic sub-region. Then, a fifth oxide layer is formed covering all logic sub-regions. Thus, first portions of the first, second, third, fourth, and fifth oxide layers are formed on the first logic sub-region and collectively serve as a first gate dielectric with the greatest thickness; second portions of the second, third, fourth, and fifth oxide layers are formed on the second logic sub-region and collectively serve as a second gate dielectric with a thickness smaller than the first gate dielectric; third portions of the third, fourth, and fifth oxide layers are formed on the third logic sub-region and collectively serve as a third gate dielectric with a thickness smaller than the second gate dielectric; fourth portions of the fourth and fifth oxide layers are formed on the fourth logic sub-region and collectively serve as a fourth gate dielectric with a thickness smaller than the third gate dielectric; and a fifth portion of the fifth oxide layer is formed on the fifth logic sub-region and serves as a fifth gate dielectric with a thickness smaller than the fourth gate dielectric.

To achieve desired gate capacitance and improve leakage performance, a nitrogen plasma treatment and an annealing process are performed to the first, second, third, and fourth oxide layers after forming the fourth oxide layer covering all logic sub-regions. However, it was found that residues may develop and deposit on the IC when patterning and removing the first, second, third, and fourth oxide layers from the fifth logic sub-region. These residues introduce contamination and defects to the IC, which may lead to a downgrade of the IC or a failure of the IC.

In view of the foregoing, various embodiments of the present application are directed to a method for forming an integrated circuit (IC) to solve the residue defect issue, and the associated integrated circuit. In the example scenario stated above, instead of removing the first, second, third, and fourth oxide layers from the fifth logic sub-region after the nitrogen plasma treatment and the annealing process, the first, second, and third oxide layers are removed from the fifth logic sub-region while also being removed from the fourth logic sub-region (prior to the nitrogen plasma treatment and the annealing process). Then the fourth oxide layer is formed on the fourth and fifth logic sub-regions and selectively removed from the fifth logic sub-region after the nitrogen plasma treatment and the annealing process. Thus, residues from the treated first, second, and third oxide layers in the fifth logic sub-region are avoided, and less residue defects are presented.

In some further embodiments, a stack of gate dielectric precursor layers is formed on a plurality of logic sub-region and then selectively removed from at least two logic sub-regions. Then a fourth gate dielectric precursor layer is formed on the at least two logic sub-regions. Further, a plasma treatment process and an annealing process are subsequently performed. The fourth gate dielectric precursor layer is then selectively removed from a low-voltage logic sub-region of the at least two logic sub-regions of the logic region, but not from a high-voltage logic sub-region of the at least two logic sub-regions of the logic region. Then, a fifth gate dielectric precursor layer is formed and patterned to form a low-voltage logic gate dielectric overlying the low-voltage logic sub-region. The fourth and fifth gate dielectric precursor layers are patterned to collectively form a high-voltage logic gate dielectric overlying the high-voltage logic sub-region. A conductive layer is formed and patterned overlying the low-voltage logic sub-region and the high-voltage logic sub-region to respectively form a high-voltage logic gate electrode on the high-voltage logic gate dielectric and a low-voltage logic gate electrode on the low-voltage logic gate dielectric. By removing the stack of gate dielectric precursor layers from the low-voltage logic sub-region and the high-voltage logic sub-region prior to performing the plasma treatment process and the annealing process, less gate dielectric precursor material is treated, annealed, and removed from the low-voltage logic sub-region. Thus, the resulting residues are reduced, and the defects introduced by the resulting residues are also reduced or eliminated. Accordingly, the manufacturing yield is increased.

FIGS. 1-4 illustrate a series of cross-sectional views of some embodiments of a method for forming an embedded memory integrated circuit (IC). As shown in FIG. 1, a substrate 104 is provided including a logic region 104*l* having a plurality of logic sub-regions 104$l_1$, 104$l_2$, 104$l_3$, 104$l_4$, and 104$l_5$. The plurality of logic sub-regions 104$l_1$, 104$l_2$, 104$l_3$, 104$l_4$, and 104$l_5$ correspond to logic devices to be formed on the logic sub-regions 104$l_1$, 104$l_2$, 104$l_3$, 104$l_4$, and 104$l_5$, where the logic devices are configured to operate at different voltages. A stack of gate dielectric precursor layers, including a first gate dielectric precursor layer 171, a second gate dielectric precursor layer 172, and a third gate dielectric precursor layer 173, are formed on the first logic sub-region 104$l_1$, the fourth logic sub-region 104$l_4$, and the fifth logic sub-region 104$l_5$. In some embodiments, the first gate dielectric precursor layer 171 may be patterned to selectively remove a the first gate dielectric precursor layer 171 from the second logic sub-region 104$l_2$ and the third logic sub-region 104$l_3$, while leaving the second and third gate dielectric precursor layers 172, 173 on the second logic sub-region 104$l_2$. The second gate dielectric precursor layer 172 may be patterned to selectively remove a the second gate dielectric precursor layer 172 from the third logic sub-region 104$l_3$, while leaving the third gate dielectric precursor layer 173 on the third logic sub-region 104$l_3$. In some embodiments, the first, second, and third gate dielectric precursor layers 171, 172, 173 are silicon dioxide layers. The first, second and third gate dielectric precursor layers 171, 172, 173 can also be formed by some other suitable dielectric material(s). The first, second, and third gate dielectric precursor layers 171, 172, 173 may, for example, be performed by CVD, PVD, sputtering, or some other suitable deposition process(es).

Figure 2:
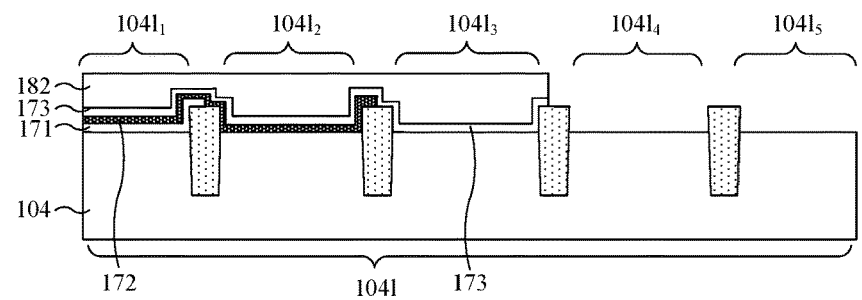

As shown in FIG. 2, the first, second, and third gate dielectric precursor layers 171, 172, 173 are removed at least from the fourth logic sub-region 104$l_4$ and the fifth logic sub-region 104$l_5$. In some embodiments, an etching process is performed with a masking layer 182 (e.g. a photoresist layer) covering the first, second, and third logic sub-regions 104$l_1$, 104$l_2$, 104$l_3$. An etchant is applied to the first, second, and third gate dielectric precursor layers 171, 172, 173 with the masking layer 182 in place until the etchant reaches the substrate 104, and the masking layer 182 is thereafter removed.

Figure 3:
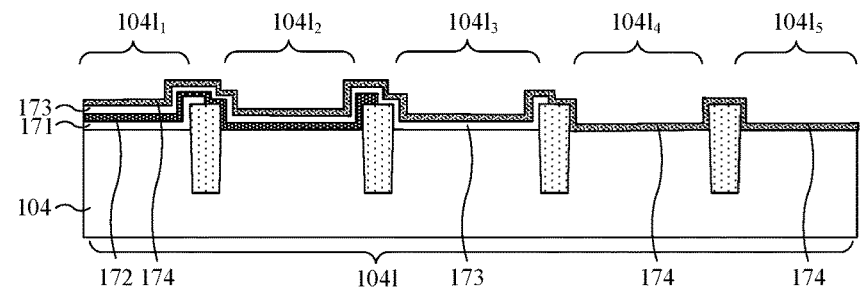

As shown in FIG. 3, a fourth gate dielectric precursor layer 174 is formed to cover the logic region 104*l*. The fourth gate dielectric precursor layer 174 may be formed on the third gate dielectric precursor layer 173 at the first, second and third logic sub-regions 104$l_1$, 104$l_2$, 104/3, and directly on the substrate 104 at the fourth logic sub-region 104$l_4$ and the fifth logic sub-region 104$l_5$. In some embodiments, the fourth gate dielectric precursor layer 174 is a silicon dioxide layer. The fourth gate dielectric precursor layer 174 can also be formed by some other suitable dielectric material(s), and/or may, for example, be performed by CVD, PVD, sputtering, or some other suitable deposition process(es). In some embodiments, a plasma treatment process and an annealing process are performed to the stack of gate dielectric precursor layers and the fourth gate dielectric precursor layers 171-174. The plasma treatment process may comprise a nitrogen plasma treatment process.

Figure 4:
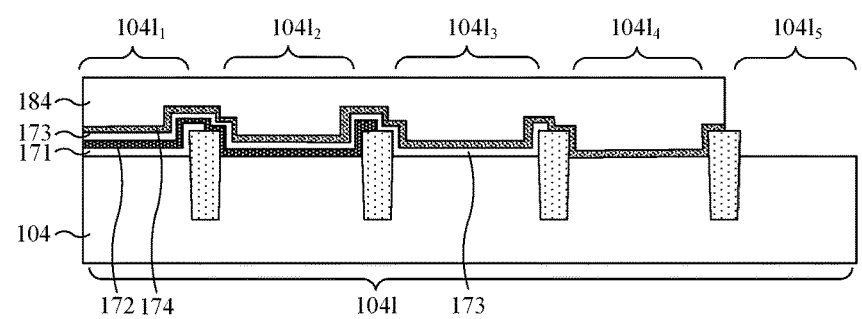

As shown in FIG. 4, the fourth gate dielectric precursor layer 174 is removed from the fifth logic sub-region 104$l_5$. In some embodiments, an etching process is performed with a masking layer 184 (e.g., a photoresist layer) covering the first, second, third, and fourth logic sub-regions 104$l_1$, 104$l_2$, 104$l_3$, 104$l_4$. An etchant is applied to the fourth gate dielectric precursor layer 174 with the masking layer 184 in place until the etchant reaches the substrate 104, and the masking layer 184 is thereafter removed. By comparison to a previous approach, the first, second, and third gate dielectric precursor layers 171, 172, 173 are kept on the fifth logic sub-region 104l₅ in the process step shown in FIG. 2 and are removed together with the fourth gate dielectric precursor layer 174 during the process step shown in FIG. 4. By removing the first, second, and third gate dielectric precursor layers 171, 172, 173 from the fifth logic sub-region 104l₅ and the fourth logic sub-region 104l₄ prior to performing the plasma treatment process and the annealing process, less gate dielectric precursor material is treated, annealed, and removed from the fifth logic sub-region 104l₅. Thus, the residues from the plasma treatment process are reduced since the first, second and third gate dielectric precursor layers 171, 172, 173 are removed beforehand. Further, the defects introduced by the resulting residues are also reduced or eliminated. Accordingly, the manufacturing yield is increased.

Figure 5:
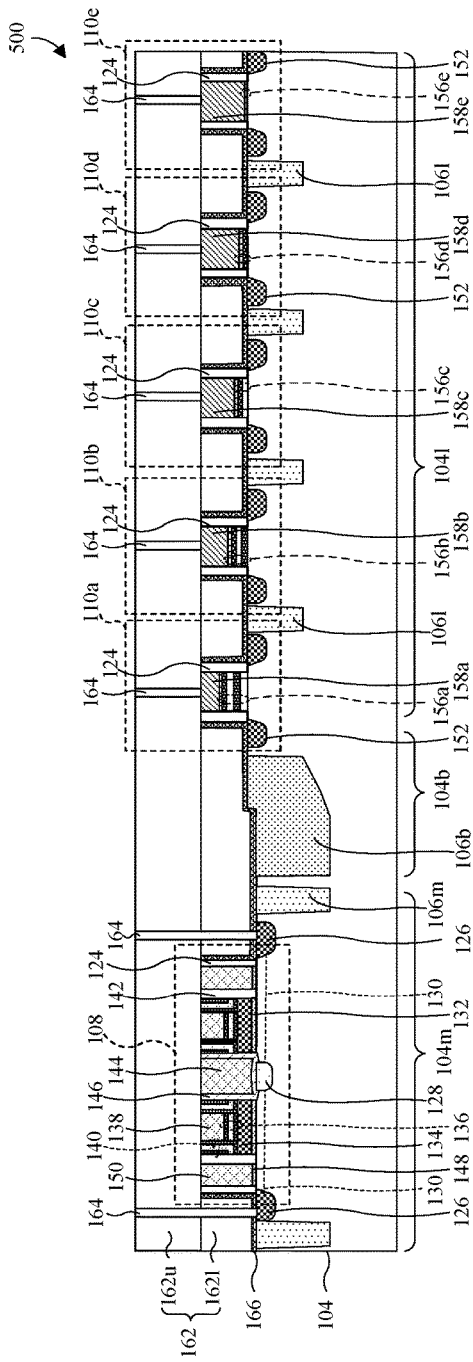
FIGS. 5-6 illustrate cross-sectional views of some embodiments of an integrated circuit (IC) comprising a plurality of logic devices operating at different voltages.

FIG. 5 shows a cross-sectional view of an IC 500 comprising a plurality of logic devices operating at different voltages according to some embodiments. The IC 500 has a substrate 104 including a memory region 104m and a logic region 104l separated by a boundary region 104b. A memory cell structure 108 is disposed on the memory region 104m. A plurality of logic devices is disposed on a plurality of corresponding logic sub-regions. For example, a first logic device 110a is disposed on a first logic sub-region 104l₁, a second logic device 110b is disposed on a second logic sub-region 104l₂, a third logic device 110c is disposed on a third logic sub-region 104l₃, a fourth logic device 110d is disposed on a fourth logic sub-region 104l₄, and a fifth logic device 110e is disposed on a fifth logic sub-region 104l₅. The first logic device 110a may be used to drive memory cells and may have a relatively high operating voltage level. For example, the relatively high operating voltage level may be greater than 10V, but other suitable voltages are amenable. The second logic device 110b may be a medium voltage device (e.g., an RF (radio frequency) device or a MIM (metal-insulator-metal) device) and may have an operating voltage level smaller than the high voltage device. For example, the operating voltage level of the second logic device 110b may be around 5V, but other suitable voltages are amenable. The third logic device 110c may be an I/O (input and output) device and may have an operating voltage level smaller than the second logic device. For example, the operating voltage level of the third logic device 110c may be around 1.5V to 3V, but other suitable voltages are amenable. The fourth logic device 110d may be a word line device and may have an operating voltage level smaller than the third logic device 110c For example, the operating voltage level of the fourth logic device 110d may be around 1V to 2V, but other suitable voltages are amenable. The fifth logic device 110e may be a core device and may have an operating voltage level smaller than the fourth logic device 110d. For example, the operating voltage level of the fifth logic device 110e may be smaller than 1.5V, but other suitable voltages are amenable. The logic devices 110a-110e may each be, for example, an IGFET, a MOSFET, a DMOS device, a BCD device, some other suitable transistor device(s), or some other suitable semiconductor device(s).

In some embodiments, the logic devices 110a-110e respectively comprises a pair of logic source/drain regions 152 within the substrate 104. The logic source/drain regions 152 are disposed on opposite sides of corresponding logic gate electrodes 158a-158e and logic gate dielectrics 156a-156e. The pair of logic source/drain regions 152 is heavily doped semiconductor regions having a first doping type (e.g., p-type or n-type). For ease of illustration, for components sharing a numeral, only one or some of the components are labeled, and some other components that have the same shading, the symmetrical location, and/or repeated structures may not be labeled. For example, only some of the logic source/drain regions are labeled 152, but regions symmetrical to the labeled source/drain regions 152 along the corresponding gate electrode represents the other of the pair of source/drain regions. The source/drain regions for the first logic device 110a is labeled, but the similar source/drain regions for the second logic device 110b is not labeled. The operation voltages of the first, second, third, fourth, and fifth logic devices 110a, 110b, 110c, 110d and 110e decrease monotonically in the order, and so are the thicknesses of the corresponding logic gate dielectrics 156a, 156b, 156c, 156d, and 156e. Though not shown in FIG. 5, a silicide pad may be disposed on the logic gate electrodes 158a-158e. The silicide pad may be or otherwise comprise, for example, nickel silicide or some other suitable silicide(s). A silicide pad can also be formed on the logic source/drain regions 152. In some embodiments, the logic gate electrodes 158a-158e may comprise metal. The logic gate electrodes 158a-158e may also be or otherwise comprise a conductive material, for example, doped polysilicon or some other suitable conductive material(s). The logic gate dielectrics 156a-156e may be or otherwise comprise, for example, silicon nitride, silicon oxide, a high κ dielectric, some other suitable dielectric(s), or any combination of the foregoing. As used herein and hereafter, a high κ dielectric is a dielectric with a dielectric constant κ greater than about 3.9. During operation, by applying a bias, the logic gate electrodes 158a-158e respectively control carriers flowing between the corresponding pair of logic source/drain regions 152 through a corresponding logic channel within the substrate 104 underlying the corresponding logic gate electrode. The logic channel is a doped semiconductor region having a second doping type (e.g., p-type or n-type) opposite the first doping type.

The substrate 104 may comprise, for example, a bulk silicon substrate, a group III-V substrate, a silicon-on-insulator (SOI) substrate, or some other suitable semiconductor substrate(s). In some embodiments, the memory cell structure 108 comprises a pair of individual memory source/drain regions 126 and a common memory source/drain region 128 separated by a pair of memory channels 130. The individual memory source/drain regions 126 and the common memory source/drain region 128 are doped semiconductor regions having a first doping type (e.g., p-type or n-type). The memory channels 130 are doped semiconductor regions having a second doping type (e.g., p-type or n-type) opposite the first doping type.

A pair of control gate electrodes 138, a pair of control gate dielectric layers 136, a pair of floating gate electrodes 134, and a pair of floating gate dielectric layer 132 are stacked on the memory channels 130. In some embodiments, the control gate dielectric layers 136 may comprise a tri-layer structure. For example, in some embodiments, the tri-layer structure may comprise an ONO structure having a first dielectric layer (e.g. a silicon dioxide layer), a nitride layer (e.g. a silicon nitride layer) contacting the first dielectric layer, and a second dielectric layer (e.g. a silicon dioxide layer) contacting the nitride layer. A control gate spacer 140 lines opposite sidewalls of each of the control gate electrodes 138 overlying each of the floating gate electrodes 134. A floating gate spacer 142 lines a sidewall of the floating gate electrodes 134. The control gate spacers 140 and the floating gate spacers 142 may be or otherwise comprise, for example, silicon nitride, silicon oxide, some other suitable dielectric(s), or any combination of the foregoing. In some embodiments, the control gate spacers 140 may comprise ONO films. A pair of select gate dielectric layers 148 and a pair of select gate electrodes 150 are stacked on the selectively-conductive memory channels 130. An erase gate electrode 144 and an erase gate dielectric layer 146 overlie the common memory source/drain region 128, laterally between the floating gate electrodes 134. The erase gate electrode 144 may be or otherwise comprise, for example, doped polysilicon, metal, or some other suitable conductive material(s). The erase gate dielectric layer 146 may be or otherwise comprise, for example, silicon oxide, silicon nitride, or some other suitable dielectric(s). During operation, charges (e.g., electrons) can be injected to the floating gate electrode 134 to program the memory cell structure 108. A low voltage is applied to minimize drain current and leads to a relatively small programming power. A high voltage is applied to the control gate electrode 138 to attract or repel electrons to or from the floating gate electrode 134, thereby yielding a high injection or removal efficiency. The memory cell structure 108 may be or otherwise comprise, for example, third generation embedded super flash (ESF3) memory, first generation embedded super flash (ESF1) memory, silicon-oxide-nitride-oxide-silicon (SONOS) memory, metal-oxide-nitride-oxide-silicon (MONOS) memory, or some other suitable type(s) of memory.

In some embodiments, a plurality of isolation structures is disposed within the substrate 104. The isolation structures may comprise a memory isolation structure 106m disposed within the memory region 104m and surrounding the memory cell structure 108. Further, the isolation structures may comprise a logic isolation structure 106l within the logic region 104l, between the logic devices 110a-110e. Further yet, the isolation structures may comprise a boundary isolation structure 106b within the boundary region 104b. The logic devices 110a-110e are physically and electrically separated by the logic isolation structure 106l. The plurality of isolation structures may be or otherwise comprise, for example, a shallow trench isolation (STI) structure, a deep trench isolation (DTI) structure, or some other suitable isolation structure(s). In some embodiments, the memory isolation structure 106m, the logic isolation structure 106l, and the boundary isolation structure 106b may extend to the same or substantially same depth in the substrate 104.

In some embodiments, a main sidewall spacer 124 lines sidewall surfaces of the logic gate electrodes 158a-158e and the logic gate dielectrics 156a-156e. The main sidewall spacer 124 may also have components disposed along sidewalls of the select gate electrodes 150 in the memory region 104m. The main sidewall spacer 124 may be or otherwise comprise, for example, silicon nitride, silicon oxide, or some other suitable dielectric(s). Further, in some embodiments, a contact etch stop layer (CESL) 166 is disposed along an upper surface of the substrate 104 and extends upwardly along sidewall surfaces of the main sidewall spacer 124. Further, in some embodiments, the CESL 166 is separated from the logic gate electrodes 158a-158e and the logic gate dielectrics 156a-156e by the main sidewall spacer 124. An inter-layer dielectric (ILD) layer 162 is disposed on the contact etch stop layer (CESL) 166 and covers the logic devices 110a-110e. Further, the ILD layer 162, is between and overlies the memory cell structure 108 and the logic devices 110a-110e. The inter-layer dielectric (ILD) layer 162 may be or otherwise comprise, for example, silicon oxide, silicon nitride, a low κ dielectric, some other suitable dielectric(s), or any combination of the foregoing. As used herein, a low κ dielectric is a dielectric with a dielectric constant κ less than about 3.9. Further yet, in some embodiments, contact vias 164 extend through the inter-layer dielectric (ILD) layer 162 to the logic source/drain regions 152 and the logic gate electrodes 158a-158e. The contact vias 164 are conductive and may be or otherwise comprise, for example, tungsten, aluminum copper, copper, aluminum, some other suitable metal(s), or some other suitable conductive material(s). In some embodiments, the inter-layer dielectric (ILD) layer 162 may comprise a plurality of dielectric layers made of the same or different materials. For example, the inter-layer dielectric (ILD) layer 162 may comprise a lower ILD layer 162l and an upper ILD layer 162u stacked one on another. The lower ILD layer 162l may have a top surface even with that of the memory cell structure 108 and/or the logic devices 110a-110e.

Figure 6:
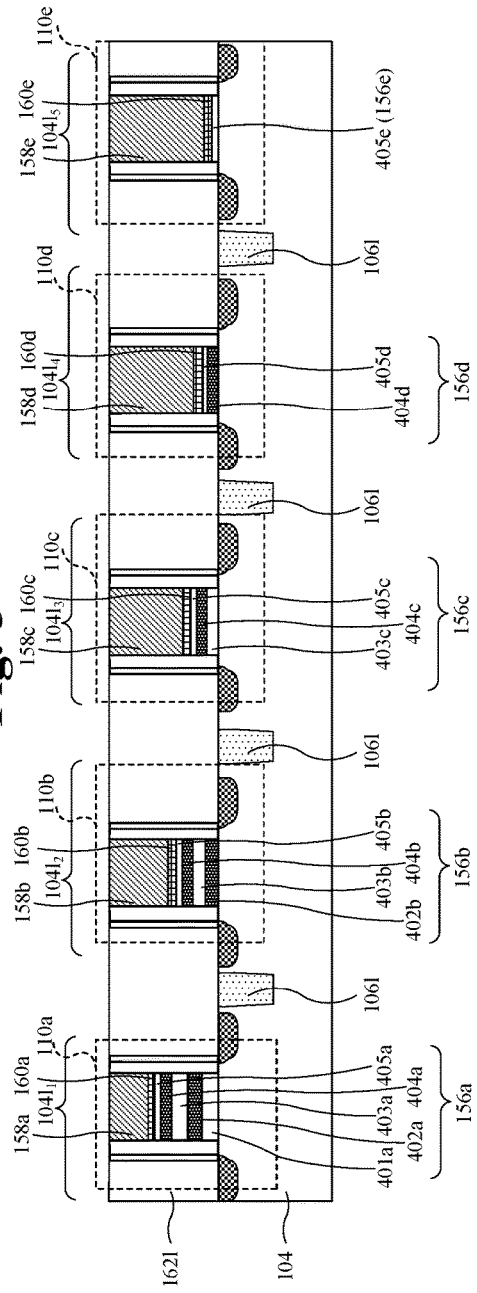

FIG. 6 illustrates a cross-sectional view of the logic region 104l of FIG. 5 in more detail according to some embodiments. From bottom to top, the first gate dielectric 156a of the first logic device 110a comprises a first portion 401a of a first gate dielectric precursor layer, a first portion 402a of a second gate dielectric precursor layer, a first portion 403a of a third gate dielectric precursor layer, a first portion 404a of a fourth gate dielectric precursor layer, and a first portion 405a of a fifth gate dielectric precursor layer. The second logic gate dielectric 156b of the second logic device 110b comprises a second portion 402b of the second gate dielectric precursor layer, a second portion 403b of the third gate dielectric precursor layer, a second portion 404b of the fourth gate dielectric precursor layer, and a second portion of 405b of the fifth gate dielectric precursor layer. The third gate dielectric 156c of the third logic device 110c comprises a third portion 403c of the third gate dielectric precursor layer, a third portion 404c of the fourth gate dielectric precursor layer, and a third portion 405c of the fifth gate dielectric precursor layer. The fourth gate dielectric 156d of the fourth logic device 110d comprises a fourth portion 404d of the fourth gate dielectric precursor layer and a fourth portion 405d of the fifth gate dielectric precursor layer. The fifth gate dielectric 156e of the fifth logic device 110e comprises a fifth portion 405e of the fifth gate dielectric precursor layer. The portions of each of the gate dielectric precursor layers (i.e., the first, second, third, fourth, or fifth gate dielectric precursor layer) have the same composition and thickness. In some embodiments, portions 160a-160e of a high κ dielectric layer are stacked on top of the gate dielectrics, directly below the corresponding logic gate electrodes 158a, 158b, 158c, 158d, or 158e.

With reference to FIGS. 7-26, a series of cross-sectional views 700-2600 illustrates some embodiments of a method for forming an IC comprising a plurality of logic devices operating at different voltages.

Figure 7:
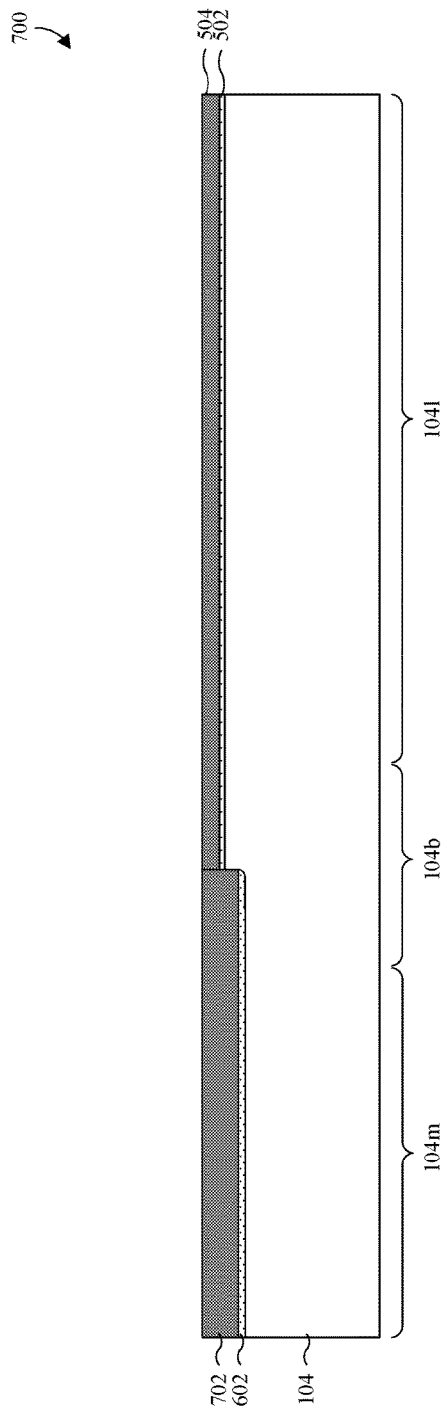

As illustrated by the cross-sectional view 700 of FIG. 7, a substrate 104 is provided. The substrate 104 includes a memory region 104m and a logic region 104l separated by a boundary region 104b. In some embodiments, a lower pad layer 502 is formed on the logic region 104l, and an upper pad layer 504 is formed covering the lower pad layer 502. The substrate 104 may be recessed within the memory region 104m, and a memory dielectric layer 602 is formed overlying the memory region 104m. In some embodiments, the upper pad layer 504 may be formed to cover the substrate 104 and may be patterned to form an opening corresponding to the memory region 104m. A top surface of the substrate 104 is then recessed at the memory region 104m, and the memory dielectric layer 602 is formed. A memory pad layer 702 is formed on the memory dielectric layer 602 at the memory region 104m. The lower pad layer 502 and the upper pad layer 504 are formed of different materials and may, for example, be formed by chemical vapor deposition (CVD), physical vapor deposition (PVD), sputtering, thermal oxidation, or some other suitable growth or deposition process(es). As used herein, a term (e.g., process) with a suffix of "(es)" may, for example, be singular or plural. The lower pad layer 502 may, for example, be formed of silicon oxide or some other suitable dielectric(s), and/or the upper pad layer 504 may, for example, be formed by silicon nitride or some other suitable dielectric(s). The memory pad layer 702 may be formed by depositing a dielectric material covering the memory region 104m, the logic region 104l, and the boundary region 104b. Then a planarization process is performed and may remove the memory pad layer 702 from the logic region 104l. The memory dielectric layer 602 may, for example, be formed of silicon oxide or some other suitable dielectric(s), and/or the memory pad layer 702 may, for example, be formed by silicon nitride or some other suitable dielectric(s).

Figure 8:
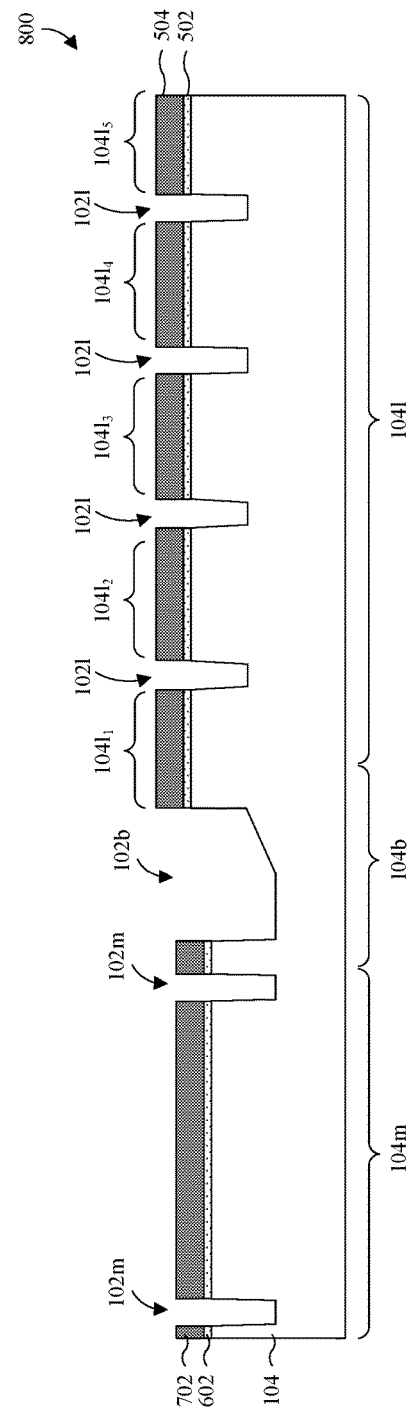
Figure 9:
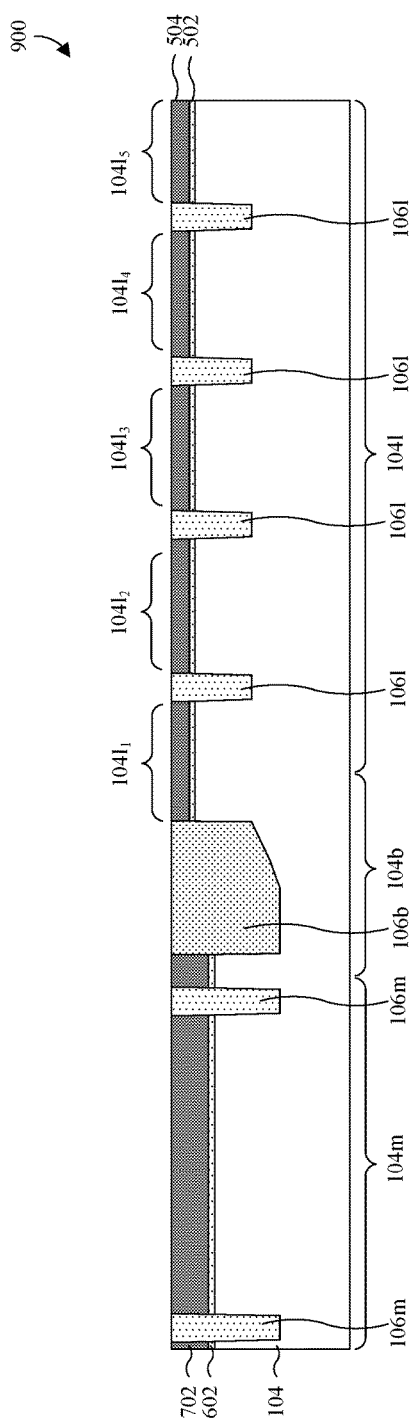

As illustrated by the cross-sectional views 800-900 of FIGS. 8-9, a plurality of isolation structures is formed within the substrate 104. In FIG. 8, an etching process is performed to form a plurality of trenches extending into the substrate 104. The trenches include a memory isolation trench 102m within the memory region 104m and a boundary trench 102b within the boundary region 104b. Further, the trenches include a logic isolation trench 102l that is within the logic region 104l and that separates a first logic sub-region $104l_1$, a second logic sub-region $104l_2$, a third logic sub-region $104l_3$, a fourth logic sub-region $104l_4$, and a fifth logic sub-region $104l_5$. The first logic sub-region $104l_1$ may, for example, be used to form a high voltage device having a relatively high operating voltage level (e.g., greater than 10V). The second logic sub-region $104l_2$ may, for example, be used to form a medium voltage device having an operating voltage level smaller than the high voltage device (e.g., around 5V). The third logic sub-region $104l_3$ may, for example, be used to form an I/O (input and output) device having an operating voltage level smaller than the medium voltage device (e.g., around 1.5V to 3V). The fourth logic sub-region $104l_4$ may, for example, be used to form a word line device having an operating voltage level smaller than the I/O (input and output) device (e.g., around 1V to 2V). The fifth logic sub-region $104l_5$ may, for example, be used to form a core device having an operating voltage level smaller than the word line device (e.g., smaller than 1.5V). In some embodiments, the etching process comprises forming and patterning a masking layer (e.g., a photoresist layer not shown in the figure) on the upper pad layer 504 and the memory pad layer 702 with a layout of the plurality of isolation structures. An etchant is then applied to the memory pad layer 702, the memory dielectric layer 602, the upper pad layer 504, the lower pad layer 502, and the substrate 104 with the masking layer in place until the etchant reaches a desired depth of the substrate 104. The masking layer is thereafter removed. In FIG. 9, the plurality of trenches is filled with dielectric material to form the plurality of isolation structures, including a memory isolation structure 106m within the memory isolation trench 102m, a boundary isolation structure 106b within the boundary trench 102b, and a logic isolation structure 106l within the logic isolation trench 102l. The dielectric material may, for example, be formed of silicon oxide or some other suitable dielectric material(s), and/or may, for example, be performed by CVD, PVD, sputtering, or some other suitable deposition process(es). The plurality of isolation structures may be formed by underetching the lower pad layer 502 (e.g., an oxide pad) first, followed by growing a liner oxide in the plurality of trenches. Then, the rest of the plurality of trenches is filled with a deposited oxide. Next, the excessive (deposited) oxide is removed with a planarization process. The planarization process may, for example, be performed by a chemical mechanical polish (CMP) or some other suitable planarization process(es). In some embodiments, the memory isolation structure 106m, the logic isolation structure 106l, and the boundary isolation structure 106b may extend to the same or substantially same depth in the substrate 104.

Figure 10:
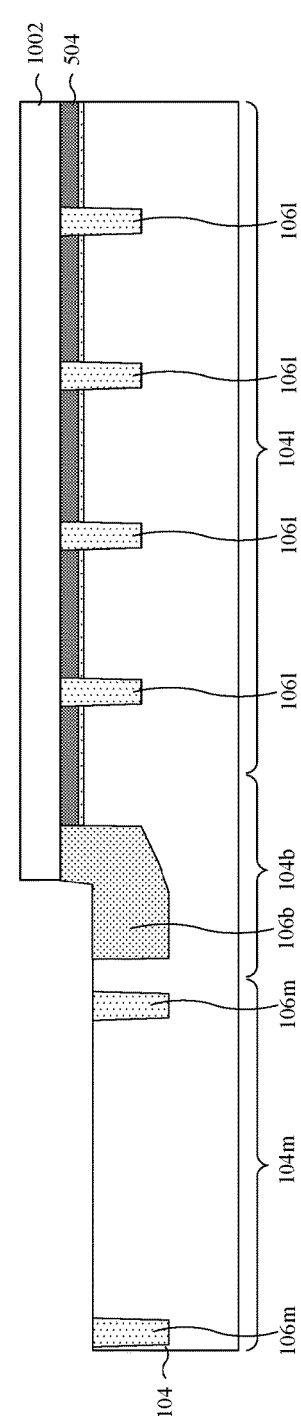
Figure 11:
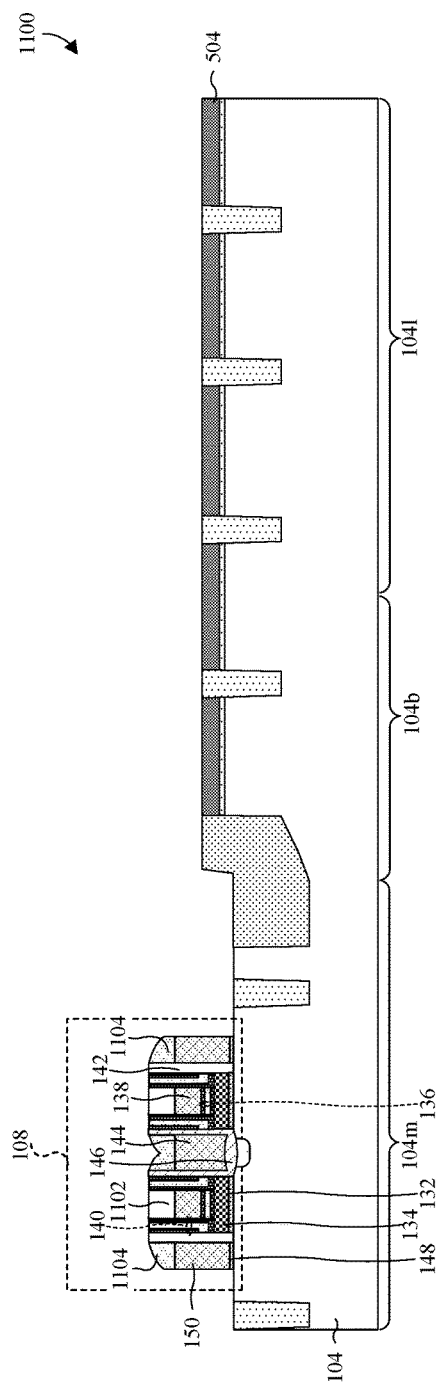

As illustrated by the cross-sectional views 1000-1100 of FIGS. 10-11, a series of manufacturing processes are performed to form a memory cell structure 108 on the memory region 104m. Some of the manufacturing processes are described below as an example and not for limiting purposes. In FIG. 10, with a masking layer 1002 covering the logic region 104l and a portion of the boundary region 104b closer to the logic region 104l, an etching process is performed to remove the memory pad layer 702, the memory dielectric layer 602, and an upper portion of the memory isolation structure 106m within the memory region 104m. An upper left portion of the boundary isolation structure 106b may be removed concurrently. The etching process may comprise a series of dry and/or wet etching processes. The masking layer 1002 may be formed by photoresist. In FIG. 11, a pair of control gate electrodes 138, a pair of control gate dielectric layers 136, a pair of floating gate electrodes 134, and a pair of floating gate dielectric layer 132 are formed on the memory region 104m. In some embodiments, the control gate dielectric layers 136 may comprise a tri-layer structure. For example, in some embodiments, the tri-layer structure may comprise an ONO structure having a first dielectric layer (e.g., a silicon dioxide layer), a nitride layer (e.g., a silicon nitride layer) contacting the first dielectric layer, and a second dielectric layer (e.g., a silicon dioxide layer) contacting the nitride layer. A control gate spacer 140 is formed lining opposite sidewalls of each of the control gate electrodes 138 and overlying each of the floating gate electrodes 134. A floating gate spacer 142 is formed lining a sidewall of the floating gate electrodes 134 and the control gate spacer 140. The control gate spacers 140 and the floating gate spacers 142 may be or otherwise comprise, for example, silicon nitride, silicon oxide, some other suitable dielectric(s), or any combination of the foregoing. In some embodiments, the control gate spacers 140 may comprise ONO films. A pair of select gate dielectric layers 148 and a pair of select gate electrodes 150 are formed on opposite sides of the floating gate spacers 142. An erase gate electrode 144 and an erase gate dielectric layer 146 are formed laterally between the floating gate electrodes 134. The erase gate electrode 144 may be or otherwise comprise, for example, doped polysilicon, metal, or some other suitable conductive material(s). The erase gate dielectric layer 146 may be or otherwise comprise, for example, silicon oxide, silicon nitride, or some other suitable dielectric(s). In some embodiments, a control gate hard mask 1102 and a select gate hard mask 1104 are respectively formed on the control gate electrodes 138 and the select gate electrodes 150.

Figure 12:
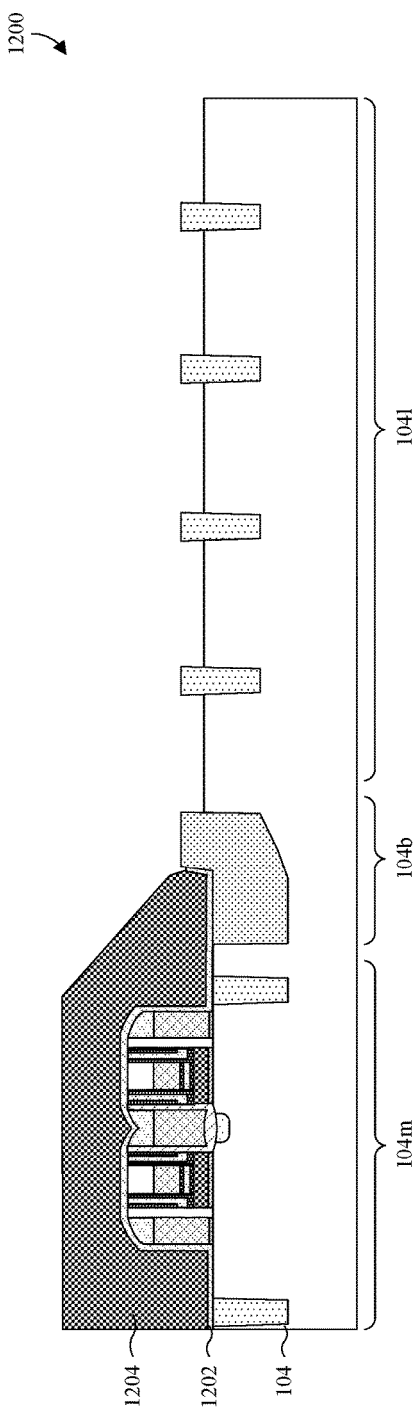

As illustrated by the cross-sectional view 1200 of FIG. 12, a dummy liner layer 1202 and a dummy capping layer 1204 are formed and patterned to cover the memory cell structure 108 but not the logic region 104l. The dummy liner layer 1202 may, for example, be formed conformally. In some embodiments, the dummy liner layer 1202 is formed of silicon oxide or some other suitable dielectric(s). In some embodiments, the dummy capping layer 1204 is formed of polysilicon or some other suitable material(s). Further, the dummy liner layer 1202 and/or the dummy capping layer 1204 may, for example, be formed by CVD, PVD, some other suitable deposition process(es), or any combination of the foregoing. Thereafter, a patterning process may be performed. In some embodiments, the patterning process is performed by forming and patterning a photoresist layer (not shown) covering the memory region 104m. An etchant is then applied with the photoresist layer in place until the etchant reaches an upper surface of the substrate 104, and the photoresist layer is thereafter stripped.

Figure 13:
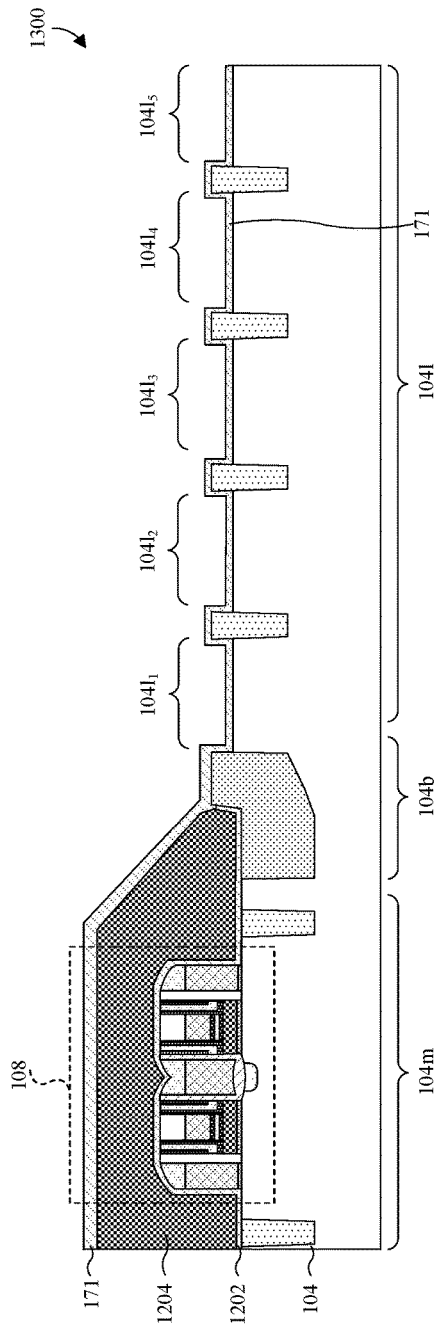
Figure 14:
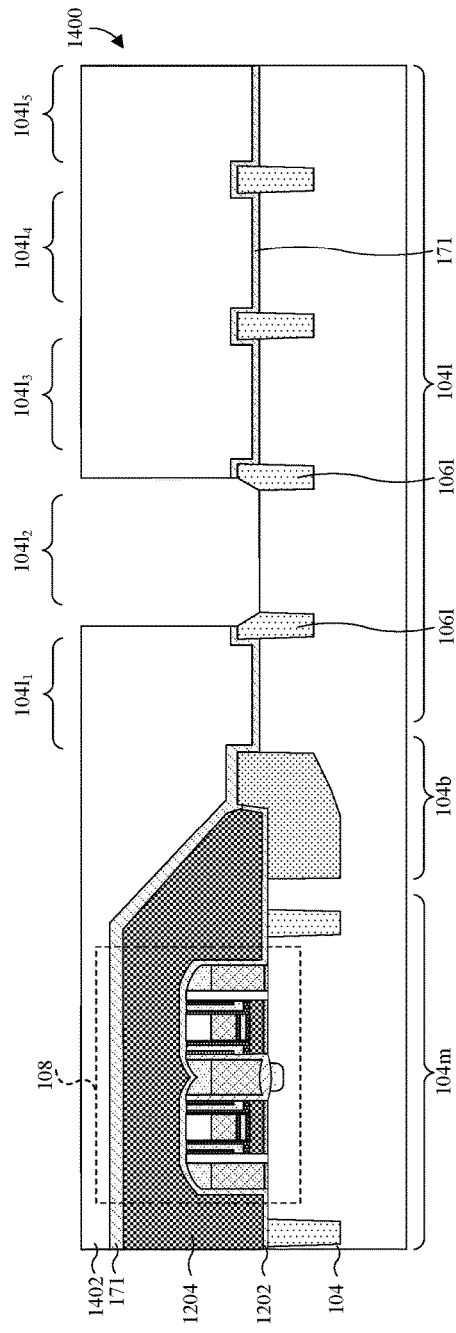

As illustrated by the cross-sectional views 1300-1400 of FIGS. 13-14, a first gate dielectric precursor layer 171 is formed and patterned. In FIG. 13, the first gate dielectric precursor layer 171 is formed to cover the first logic sub-region $104l_1$, the second logic sub-region $104l_2$, the third logic sub-region $104l_3$, the fourth logic sub-region $104l_4$, and the fifth logic sub-region $104l_5$. The first gate dielectric precursor layer 171 may be one or multiple layers of silicon dioxide, including but not limited to room temperature oxide (RTO) and/or high temperature oxide (HTO). The first gate dielectric precursor layer 171 can also be formed by some other suitable dielectric material(s), and/or may, for example, be formed by in-situ steam generation (ISSG), chemical vapor deposition (CVD), physical vapor deposition (PVD), sputtering, or some other suitable deposition process(es). In FIG. 14, a masking layer 1402 is formed and patterned on the first gate dielectric precursor layer 171. The masking layer 1402 may comprise photoresist. The masking layer 1402 may cover the first logic sub-region $104l_1$, the third logic sub-region $104l_3$, the fourth logic sub-region $104l_4$, and the fifth logic sub-region $104l_5$, but may not cover the second logic sub-region $104l_2$. The first gate dielectric precursor layer 171 may be patterned according to the masking layer 1402 to selectively remove a the first gate dielectric precursor layer 171 from the second logic sub-region $104l_2$ by an etching process. A portion of the logic isolation structure 106l closer to the second logic sub-region $104l_2$ may also be angled and partially removed as a result of the etching process. The etching process may comprise dry etching and/or wet etching.

Figure 15:
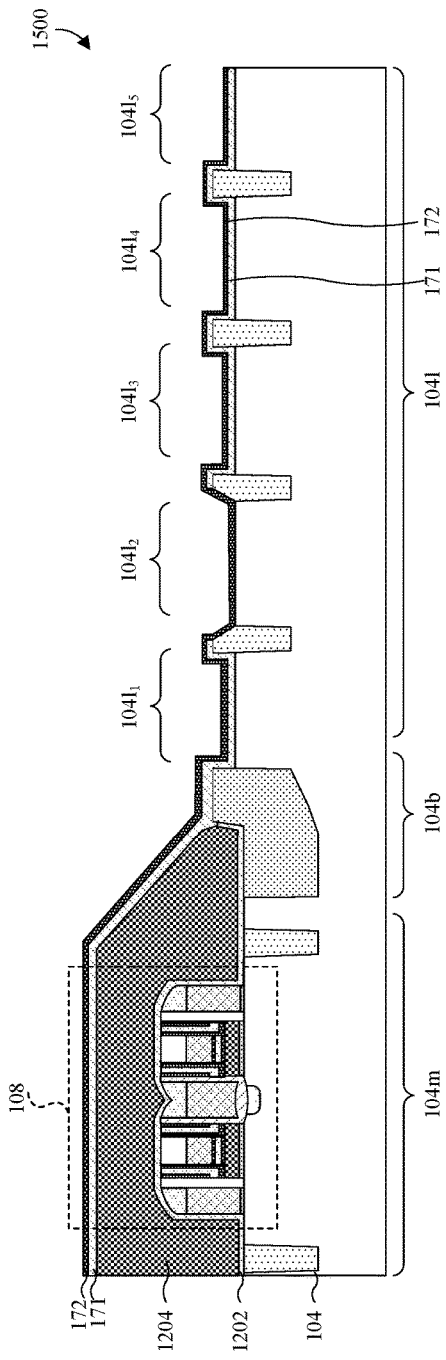
Figure 16:
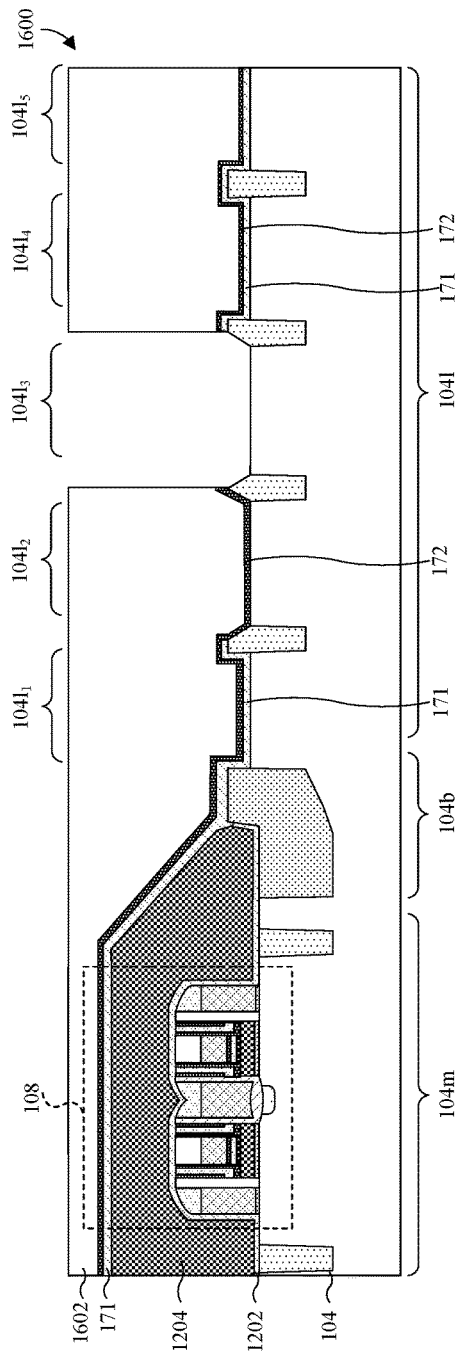

As illustrated by the cross-sectional views 1500-1600 of FIGS. 15-16, a second gate dielectric precursor layer 172 is formed and patterned. In FIG. 15, the second gate dielectric precursor layer 172 is formed covering the logic region 104l. The second gate dielectric precursor layer 172 may be formed on the first gate dielectric precursor layer 171 at the first logic sub-region $104l_1$, the third logic sub-region $104l_3$, the fourth logic sub-region $104l_4$, and the fifth logic sub-region $104l_5$. Further, the second gate dielectric precursor layer 172 may be formed directly on the substrate 104 at the second logic sub-region $104l_2$. The second gate dielectric precursor layer 172 may be one or multiple layers of silicon dioxide. The second gate dielectric precursor layer 172 can also be formed by some other suitable dielectric material(s), and/or may, for example, be performed by in-situ steam generation (ISSG), chemical vapor deposition (CVD), physical vapor deposition (PVD), sputtering, or some other suitable deposition process(es). In FIG. 16, a masking layer 1602 is formed and patterned on the second gate dielectric precursor layer 172. The masking layer 1602 may comprise photoresist. The masking layer 1602 may cover the first logic sub-region $104l_1$, the second logic sub-region $104l_2$, the fourth logic sub-region $104l_4$, and the fifth logic sub-region $104l_5$, but may not cover the third logic sub-region $104l_3$. The second gate dielectric precursor layer 172 and the first gate dielectric precursor layer 171 may be patterned according to the masking layer 1602 to selectively remove the first and second dielectric precursor layers 171, 172 from the third logic sub-region $104l_3$ by an etching process. A portion of the logic isolation structure 106l closer to the third logic sub-region $104l_3$ may also be angled and partially removed as a result of the etching process. The etching process may comprise dry etching and/or wet etching.

Figure 17:
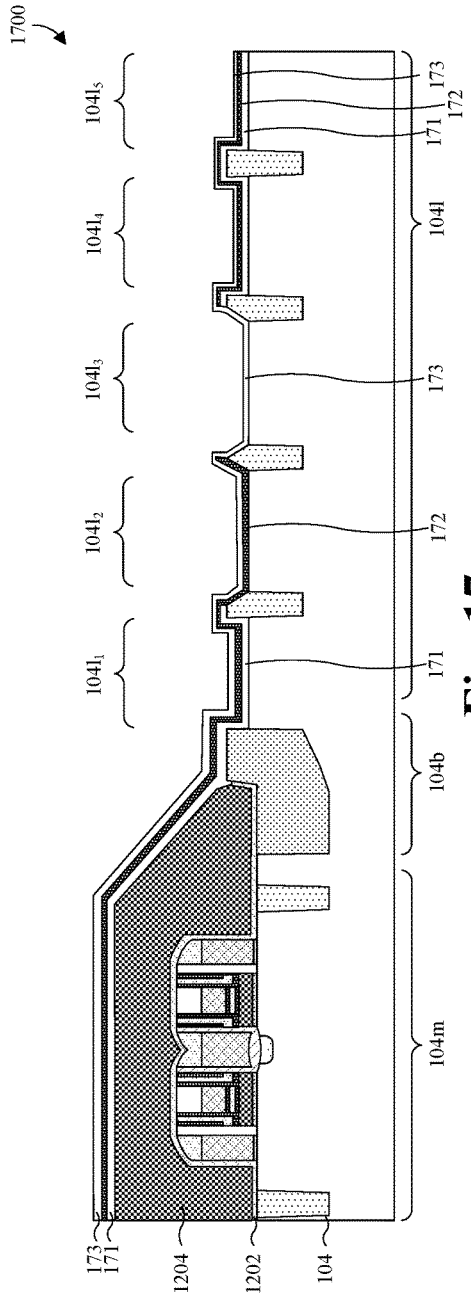
Figure 18:
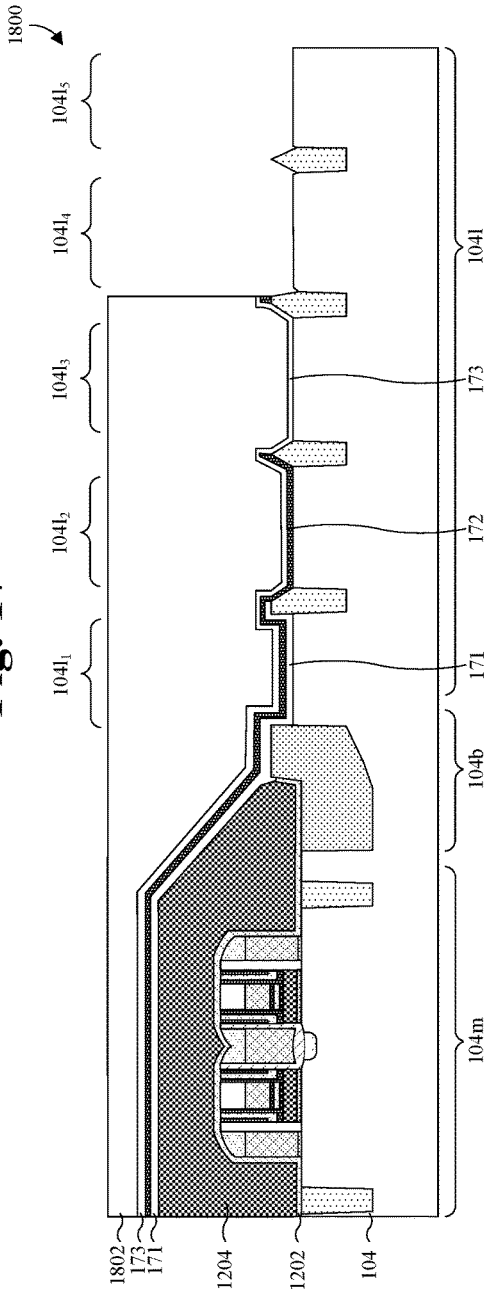

As illustrated by the cross-sectional views 1700-1800 of FIGS. 17-18, a third gate dielectric precursor layer 173 is formed and patterned. In FIG. 17, the third gate dielectric precursor layer 173 is formed covering the logic region 104l. The third gate dielectric precursor layer 173 may be formed on the second gate dielectric precursor layer 172 at the first logic sub-region $104l_1$, the second logic sub-region $104l_2$, the fourth logic sub-region $104l_4$, and the fifth logic sub-region $104l_5$. Further, the third gate dielectric precursor layer 173 may be formed directly on the substrate 104 at the third logic sub-region $104l_3$. The third gate dielectric precursor layer 173 may be one or multiple layers of silicon dioxide. The third gate dielectric precursor layer 173 can also be formed by some other suitable dielectric material(s), and/or may, for example, be performed by in-situ steam generation (ISSG), chemical vapor deposition (CVD), physical vapor deposition (PVD), sputtering, or some other suitable deposition process(es). In FIG. 18, a masking layer 1802 is formed and patterned on the third gate dielectric precursor layer 173. The masking layer 1802 may comprise photoresist. The masking layer 1802 may cover the first logic sub-region $104l_1$, the second logic sub-region $104l_2$, and the third logic sub-region $104l_3$, but may not cover the fourth logic sub-region $104l_4$ and the fifth logic sub-region $104l_5$. The first, second, and third gate dielectric precursor layer 171, 172, 173 may be patterned according to the masking layer 1802 to selectively remove the first, second, and third gate dielectric precursor layer 171, 172, 173 from the fourth logic sub-region $104l_4$ and the fifth logic sub-region $104l_5$ by an etching process. A portion of the logic isolation structure 106l closer to the fourth logic sub-region $104l_4$ and the fifth logic sub-region $104l_5$ may also be angled and partially removed as a result of the etching process. The etching process may comprise dry etching and/or wet etching.

As illustrated by the cross-sectional view 1900 of FIG. 19, a fourth gate dielectric precursor layer 174 is formed coving the logic region 104l. The fourth gate dielectric precursor layer 174 may be formed on the third gate dielectric precursor layer 173 at the first logic sub-region $104l_1$, the second logic sub-region $104l_2$, and the third logic sub-region $104l_3$. Further, the fourth gate dielectric precursor layer 174 may be formed directly on the substrate 104 at the fourth logic sub-region $104l_4$ and the fifth logic sub-region $104l_5$. The fourth gate dielectric precursor layer 174 may be one or multiple layers of silicon dioxide. The fourth gate dielectric precursor layer 174 can also be formed by some other suitable dielectric material(s), and/or may, for example, be performed by in-situ steam generation (ISSG), chemical vapor deposition (CVD), physical vapor deposition (PVD), sputtering, or some other suitable deposition process(es). In some embodiments, a plasma treatment process and an annealing process are performed to the gate dielectric precursor layers 171-174. The plasma treatment process may comprise a nitrogen plasma treatment process.

As illustrated by the cross-sectional view 2000 of FIG. 20, the fourth gate dielectric precursor layer 174 is patterned by an etching process to selectively remove the fourth gate dielectric precursor layer 174 from the fifth logic sub-region $104l_5$ according to a masking layer 2002. The masking layer 2002 may comprise photoresist. The masking layer 2002 may cover the first logic sub-region 104$l_1$, the second logic sub-region 104$l_2$, the third logic sub-region 104$l_3$, and the fourth logic sub-region 104$l_4$, but may not cover the fifth logic sub-region 104$l_5$. A portion of the logic isolation structure 106$l$ closer to the fifth logic sub-region 104$l_5$ may also be etched as a result of the etching process. The etching process may comprise wet etching using hydrofluoric acid or other applicable solutions. Compared to a previous approach where the first, second, and third gate dielectric precursor layers 171, 172, 173 are kept on the fifth logic sub-region 104$l_5$ in the process step shown in FIG. 17, and are removed together with the fourth gate dielectric precursor layer 174 during the process step shown in FIG. 20, the current approach described above has a longer etching time. For example, the first, second, third, and fourth gate dielectric precursor layers 171, 172, 173, 174 can be removed from the fifth logic sub-region 104$l_5$ by a wet dipping process for about 240 s in the previous approach. In comparison, the current approach may use a first wet dipping process taking about 220 s in the process step of FIG. 17 to remove the first, second, and third gate dielectric precursor layers 171, 172, 173, and may use a second wet dipping process taking about 50 s in the process step of FIG. 20 to remove the fourth gate dielectric precursor layer 174 from the fifth logic sub-region 104$l_5$. Thus, an extra 30 s wet dipping process is performed to the portion of the logic isolation structure 106$l$ closer to the fifth logic sub-region 104$l_5$, resulting a deeper grove relative to the upper surface of the substrate 104. By removing the first, second, and third gate dielectric precursor layers 171, 172, 173 from the fifth logic sub-region 104$l_5$ and the fourth logic sub-region 104$l_4$ (prior to performing the plasma treatment process and the annealing process), less gate dielectric precursor material is treated and removed from the fifth logic sub-region 104$l_5$ during the process step of FIG. 20. Thus, the resulting residues are reduced, and the defects introduced by the resulting residues are also reduced or eliminated. Accordingly, the manufacturing yield is increased. It is understood the disclosed method is not limited to removing gate dielectric precursor layers from the fifth logic sub-region 104$l_5$. Similar approaches can be used to process other regions of an integrated circuit.

Figure 21:
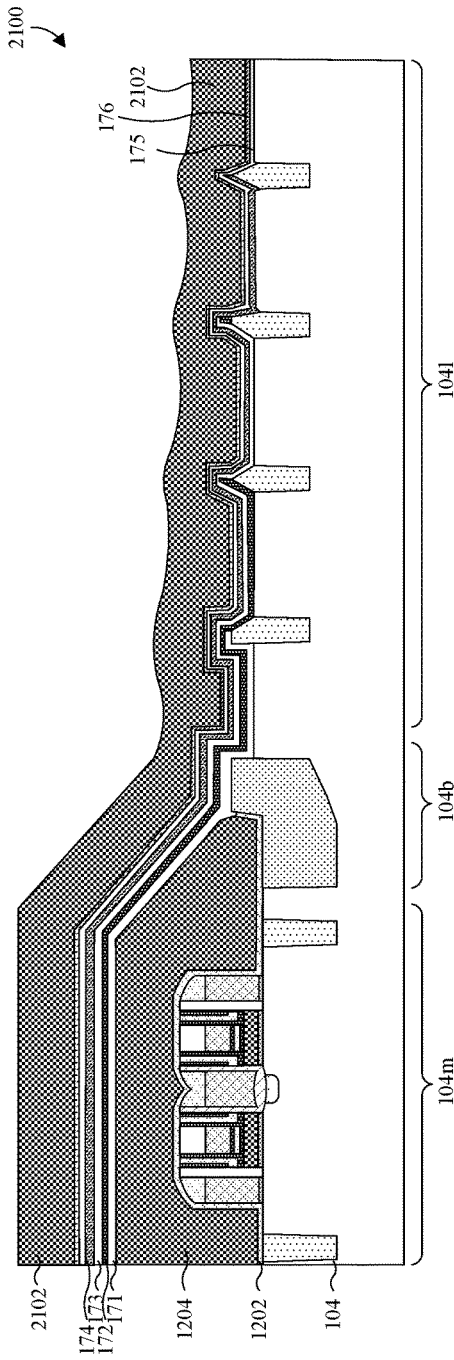

As illustrated by the cross-sectional view 2100 of FIG. 21, a fifth logic gate dielectric precursor layer 175 and a logic gate layer 2102 are formed covering the logic region 104$l$. The fifth logic gate dielectric precursor layer 175 is formed on the fourth gate dielectric precursor layer 174 at the first logic sub-region 104$l_1$, the second logic sub-region 104$l_2$, the third logic sub-region 104$l_3$, and the fourth logic sub-region 104$l_4$. Further, the fifth logic gate dielectric precursor layer 175 is formed directly on the substrate 104 at the fifth logic sub-region 104$l_5$. The fifth logic gate dielectric precursor layer 175 and the logic gate layer 2102 may, for example, be formed by CVD, PVD, some other suitable deposition process(es), or any combination of the foregoing. In some embodiments, the fifth logic gate dielectric precursor layer 175 may comprise one or multiple oxide or other dielectric layers. The logic gate layer 2102 may comprise a conductive material, such as, for example, doped polysilicon or some other suitable conductive material(s). A high κ dielectric layer 176 may be formed between the fifth logic gate dielectric precursor layer 175 and a logic gate layer 2102.

Figure 22:
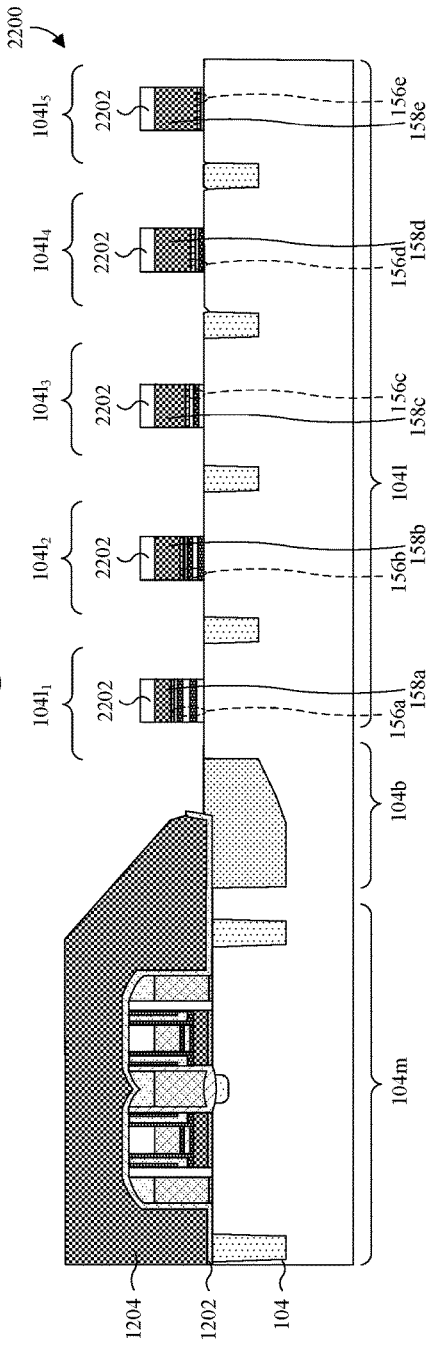

As illustrated by the cross-sectional view 2200 of FIG. 22, a series of etching processes are performed to the logic gate layer 2102 to form a plurality of logic gate electrodes 158$a$-158$e$ overlying the logic region 104$l$. The plurality of logic gate electrodes 158$a$-158$e$ may be formed according to a hard mask layer 2202 formed and patterned on the logic gate layer 2102. The logic gate dielectric precursor layers 171-175 are patterned according to the hard mask layer 2202 to form logic gate dielectrics 156$a$-156$e$ underneath corresponding logic gate electrodes 158$a$-158$e$.

Figure 23:
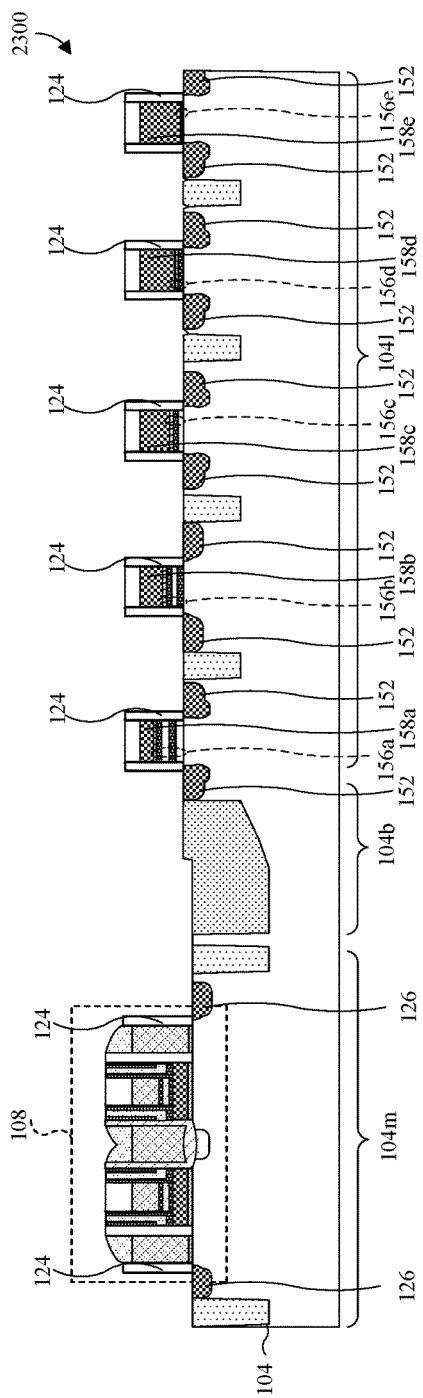

As illustrated by the cross-sectional view 2300 of FIG. 23, an etching process is performed to remove the dummy capping layer 1204 and the dummy liner layer 1202 (shown in FIG. 22) from the memory region 104$m$. The etching process may comprise a series of dry and/or wet etching processes. A masking layer (e.g., a photoresist layer, not shown) may be used to cover and protect the logic region 104$l$ from etching. A main sidewall spacer 124 is formed along sidewalls of the logic gate electrodes 158$a$-158$e$ at the logic region 104$l$ and along sidewalls of the memory cell structure 108 at the memory region 104$m$. In some embodiments, the main sidewall spacer 124 is made of silicon oxide, silicon nitride, some other suitable dielectric(s), or any combination of the foregoing. The main spacer layer may, for example, be deposited conformally, and/or may, for example, be formed by CVD, PVD, some other suitable deposition process(es), or any combination of the foregoing.

Also illustrated by the cross-sectional view 2300 of FIG. 23, a pair of memory source/drain regions 126 is formed within the memory region 104$m$, respectively bordering the memory cell structure 108. Also, logic source/drain regions 152 are formed in pairs within the logic region 104$l$, with the source/drain regions of each pair respectively bordering opposite sidewalls of the logic gate electrodes 158$a$-158$e$. In some embodiments, a process for forming the source/drain regions comprises ion implantation into the substrate 104. In other embodiments, some process other than ion implantation is used to form the source/drain regions. In some embodiments, a silicide pad is formed on the first logic gate electrode 158$a$. The silicide pad may be or otherwise comprise, for example, nickel silicide or some other suitable silicide(s), and/or may, for example, be formed by a salicide process or some other suitable growth process(es). Though not shown in the figure, silicide pads can also be formed on the memory source/drain regions 126 and the logic source/drain regions 152.

Figure 24:
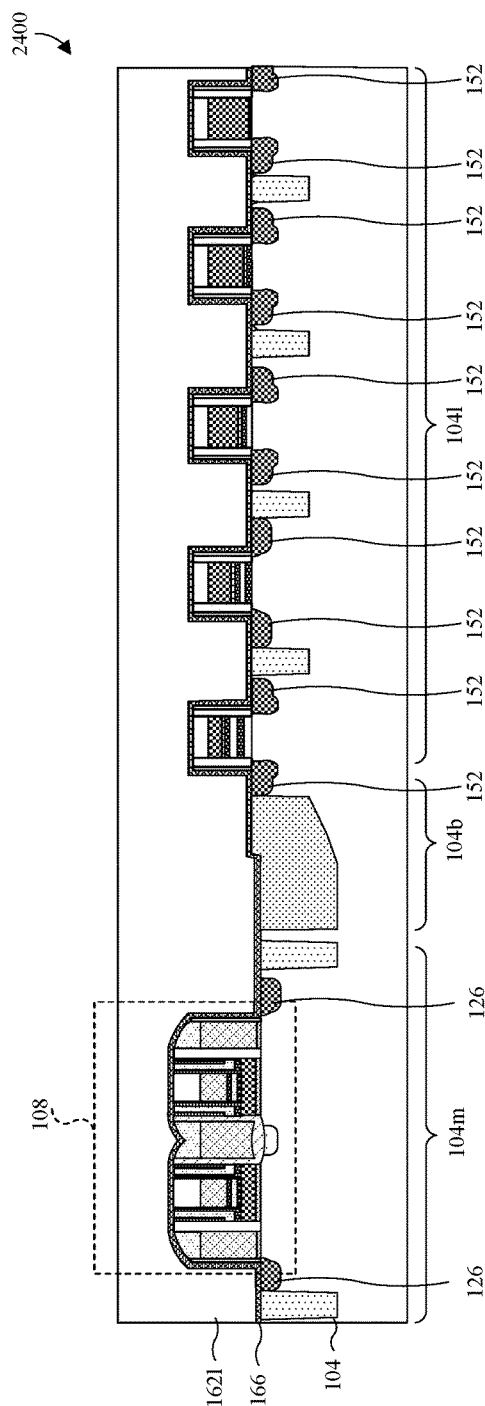

As illustrated by the cross-sectional view 2400 of FIG. 24, a contact etch stop layer (CESL) 166 and a lower inter-layer dielectric (ILD) layer 162$l$ are formed covering the structure of FIG. 23. The lower ILD layer 162$l$ may, for example, be deposited by CVD, PVD, sputtering, or any combination of the foregoing. The lower ILD layer 162$l$ may, for example, be oxide, low κ dielectric, some other suitable dielectric(s), or any combination of the foregoing.

As illustrated by the cross-sectional view 2500 of FIG. 25, a planarization process is performed to the lower inter-layer dielectric (ILD) layer 162$l$ and the contact etch stop layer (CESL) 166. The planarization process may remove the hard masks shown in FIG. 24 and may expose the corresponding gate electrodes. The planarization process may be, for example, a CMP or some other suitable planarization process(es). The planarization process may also recess a top surface of the lower ILD layer 162$l$ to about even with top surfaces of the logic gate electrodes 158$a$-158$e$, thereby exposing the logic gate electrodes 158$a$-158$e$. In some embodiments, a replacement gate process is then performed. An etching process is firstly performed to remove the logic gate electrodes 158$a$-158$e$ (referring to FIG. 24). A plurality of metal gate electrodes 158$a$'-158$e$' is then formed in place of the logic gate electrodes 158$a$-158$e$. The metal gate electrodes 158$a$'-158$e$' may, for example, be metal, a different material than the logic gate electrodes 158$a$-158$e$, or some other suitable conductive material(s). In some embodiments, a process for forming the metal gate electrodes 158a'-158e' comprises forming a conductive layer by, for example, CVD, PVD, electroless plating, electroplating, or some other suitable growth or deposition process(es). A planarization is then performed into the conductive layer until the lower ILD layer 162l is reached. The planarization may, for example, be performed by a CMP or some other suitable planarization process(es).

As illustrated by the cross-sectional view 2600 of FIG. 26, an upper ILD layer 162u is formed covering the structure of FIG. 25 and with a top surface that is planar or substantially planar. The upper ILD layer 162u may, for example, be oxide, a low κ dielectric, some other suitable dielectric(s), or any combination of the foregoing. Further, the upper ILD layer 162u may, for example, be formed by depositing the upper ILD layer 162u, and subsequently performing a planarization into the top surface of the upper ILD layer 162u. The deposition may, for example, be performed by CVD, PVD, sputtering, or any combination of the foregoing. The planarization may, for example, be performed by a CMP or some other suitable planarization process(es).

Also illustrated by the cross-sectional view 2600 of FIG. 26, contact vias 164 are formed extending through the upper ILD layer 162u and the lower ILD layer 162l to the memory source/drain regions 126 and the logic source/drain regions 152. The contact vias 164 may also be formed coupled to the control gate electrodes 138, the select gate electrodes 150, the metal gate electrodes 158a'-158e', or any combination of the foregoing.

Figure 27:
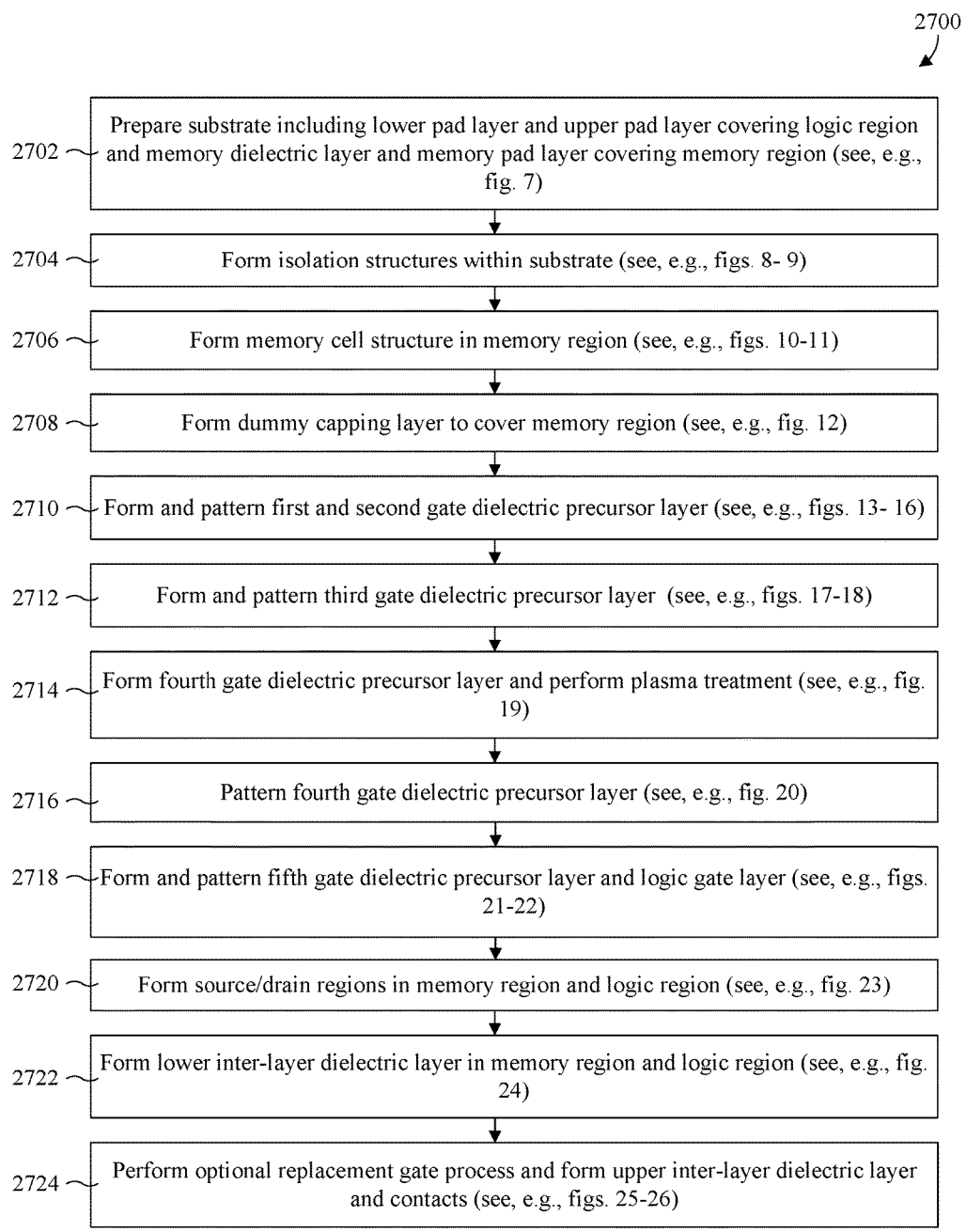
FIG. 27 illustrates a flowchart of some embodiments of the method of FIGS. 7-26.

With reference to FIG. 27, a flowchart 2700 of some embodiments of a method for forming an IC comprising a plurality of logic devices operating at different voltages is provided. The IC may, for example, correspond to the IC of FIGS. 7-26.

At 2702, a substrate is provided. The substrate includes a memory region and a logic region connected by a boundary region. In some embodiments, a lower pad layer and an upper pad layer are formed covering the logic region, and a memory dielectric layer and a memory pad layer are formed covering the memory region. See, for example, FIG. 7.

At 2704, a plurality of isolation structures is formed within the substrate. An etching process is performed to form a plurality of trenches extending into the substrate. Then, the plurality of trenches is filled with dielectric material to form the plurality of isolation structures. The plurality of isolation structures may include a memory isolation structure within the memory isolation trench, a boundary isolation structure within the boundary trench, and a logic isolation structure within the logic isolation trench. See, for example, FIGS. 8-9.

At 2706, a memory cell structure is formed within the memory region. See, for example, FIGS. 10-11.

At 2708, a dummy capping layer is formed covering the memory cell structure at the memory region. See, for example, FIG. 12.

At 2710, first and second gate dielectric precursor layers are formed and patterned. The first gate dielectric precursor layer is formed covering the logic region and is then patterned to selectively remove a the first gate dielectric precursor layer from the second logic sub-region. The second gate dielectric precursor layer is formed on the first gate dielectric precursor layer at the first, third, fourth, and fifth logic sub-regions. Further, the second gate dielectric precursor layer is formed directly on the substrate at the second logic sub-region. The second gate dielectric precursor layer and the first gate dielectric precursor layer are then patterned to selectively remove the first and second gate dielectric precursor layers from the third logic sub-region. See, for example, FIGS. 13-16.

At 2712, a third gate dielectric precursor layer is formed and patterned. The third gate dielectric precursor layer is formed on the second gate dielectric precursor layer at the first, second, fourth, and fifth logic sub-regions. Further, the third gate dielectric precursor layer is formed directly on the substrate at the third logic sub-region. The first, second, and third gate dielectric precursor layers are then patterned to selectively remove the first, second, and third gate dielectric precursor layers from the fourth logic sub-region and the fifth logic sub-region. See, for example, FIGS. 17-18.

At 2714, a fourth gate dielectric precursor layer is formed covering the logic region. The fourth gate dielectric precursor layer may be formed on the third gate dielectric precursor layer at the first, second, and third logic sub-regions. Further, the fourth gate dielectric precursor layer may be formed directly on the substrate at the fourth and fifth logic sub-regions. In some embodiments, a plasma treatment process and an annealing process are performed to the gate dielectric precursor layers. The plasma treatment process may comprise a nitrogen plasma treatment process. See, for example, FIG. 19.

At 2716, the fourth gate dielectric precursor layer is patterned to selectively remove the fourth gate dielectric precursor layer from the fifth logic sub-region. By removing the first, second, and third gate dielectric precursor layers from the fifth logic sub-region and the fourth logic sub-region (prior to performing the plasma treatment process and the annealing process), less gate dielectric precursor material is treated and removed from the fifth logic sub-region at this process step. Thus, the resulting residues are reduced, and the defects introduced by the resulting residues are also reduced or eliminated. Accordingly, the manufacturing yield is increased. See, for example, FIG. 20.

At 2718, a fifth gate dielectric precursor layer and a logic gate layer are formed and patterned to form corresponding logic gate electrodes and logic gate dielectrics. The fifth gate dielectric precursor layer is formed on the fourth gate dielectric precursor layer at the first, second, third, and fourth logic sub-regions. Further, the fifth gate dielectric precursor layer is formed directly on the substrate at the fifth logic sub-regions. The first, second, third, fourth, and fifth gate dielectric precursor layers are patterned to form corresponding logic gate dielectrics under the formed logic gate electrodes. See, for example, FIGS. 21-22.

At 2720, source/drain regions are formed in the memory region and the logic region. See, for example, FIG. 23.

At 2722, a lower inter-layer dielectric layer is formed filling spaces between the memory device structures at the memory region, and is further formed filling spaces between the logic devices at the logic region. See, for example, FIG. 24.

At 2724, a replacement gate process is performed to replace the logic gate electrodes with metal gate electrodes for the logic devices at the logic region. An upper inter-layer dielectric layer is formed on the lower inter-layer dielectric layer, the memory device structures, and the logic devices at the memory and logic regions. Contacts can be subsequently formed. See, for example, FIGS. 25-26.

While the flowchart 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein.

Further, not all illustrated acts may be required to implement one or more aspects or embodiments of the description herein, and one or more of the acts depicted herein may be carried out in one or more separate acts and/or phases.

In view of the foregoing, some embodiments of the present application are directed towards a method comprising providing a substrate including a logic region having a plurality of logic sub-regions having logic devices to be formed and configured to operate at different voltages. The method further comprises forming a stack of gate dielectric precursor layers on the plurality of logic sub-regions and removing the stack of gate dielectric precursor layers from at least two logic sub-regions. The method further comprises forming a gate dielectric precursor layer on the at least two logic sub-regions of the logic region and performing a plasma treatment process and an annealing process to the stack of gate dielectric precursor layers and the gate dielectric precursor layer. The method further comprises removing the gate dielectric precursor layer from a low-voltage logic sub-region of the at least two logic sub-regions of the logic region while keeping on a high-voltage logic sub-region of the at least two logic sub-regions of the logic region. The low-voltage logic sub-region has a logic device configured to operate at a voltage smaller than that of another logic device of the high-voltage logic sub-region.

Further, some embodiments of the present application are directed towards a method comprising providing a substrate including a memory region, a logic region, and a boundary region defined between the memory region and the logic region. The method further comprises forming a first gate dielectric precursor layer on the substrate covering the first, second, third, fourth, and fifth logic sub-regions and selectively removing the first gate dielectric precursor layer from the second logic sub-region while keeping on the first, third, fourth, and fifth logic sub-regions. The method further comprises forming a second gate dielectric precursor layer on the first gate dielectric precursor layer and the substrate covering the first, second, third, fourth, and fifth logic sub-regions and selectively removing the first and second gate dielectric precursor layers from the third logic sub-region. The method further comprises forming a third gate dielectric precursor layer on the second gate dielectric precursor layer and the substrate covering the first, second, third, fourth, and fifth logic sub-regions and selectively removing the first, second, and third gate dielectric precursor layers from the fourth and fifth logic sub-regions. The method further comprises forming a fourth gate dielectric precursor layer on the third gate dielectric precursor layer and the substrate covering the first, second, third, fourth, and fifth logic sub-regions and selectively removing the fourth gate dielectric precursor layer from the fifth logic sub-region.

Further, some embodiments of the present application are directed towards an integrated circuit (IC). The IC comprises a memory region, a logic region, and a boundary region integrated into a substrate. The boundary region is between the memory region and the logic region. A memory cell structure is disposed on the memory region. A plurality of logic devices is disposed on the logic region, including a first logic device configured to operate at a first voltage and comprising a first logic gate electrode separated from the substrate by a first logic gate dielectric, a second logic device configured to operate at a second voltage and comprising a second logic gate electrode separated from the substrate by a second logic gate dielectric, and a third logic device configured to operate at a third voltage and comprising a third logic gate electrode separated from the substrate by a third logic gate dielectric. The first, second, and third voltages monotonically decrease and wherein thicknesses of the first, second, and third logic gate dielectrics monotonically decreases.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming an integrated circuit (IC), the method comprising:
   providing a substrate including a logic region, wherein the logic region has a plurality of logic sub-regions;
   forming a stack of gate dielectric precursor layers on the plurality of logic sub-regions;
   removing the stack of gate dielectric precursor layers from at least two logic sub-regions of the logic region;
   forming a gate dielectric precursor layer on the at least two logic sub-regions of the logic region;
   performing a plasma treatment process and an annealing process to the stack of gate dielectric precursor layers and the gate dielectric precursor layer; and
   removing the gate dielectric precursor layer from a low-voltage logic sub-region of the at least two logic sub-regions of the logic region without removing the gate dielectric precursor layer from a high-voltage logic sub-region of the at least two logic sub-regions of the logic region, wherein the low-voltage logic sub-region has a logic device configured to operate at a voltage smaller than that of another logic device of the high-voltage logic sub-region.

2. The method according to claim 1, wherein the stack of gate dielectric precursor layers comprises at least a first gate dielectric precursor layer, a second gate dielectric precursor layer, and a third gate dielectric precursor layer stacked one above another.

3. The method according to claim 1, further comprising:
   forming a low-voltage gate dielectric precursor layer on the substrate at the low-voltage logic sub-region and on the gate dielectric precursor layer at the high-voltage logic sub-region;
   patterning the low-voltage gate dielectric precursor layer to form a low-voltage logic gate dielectric overlying the low-voltage logic sub-region; and
   patterning the gate dielectric precursor layer and the low voltage gate dielectric precursor layer to collectively form a high-voltage logic gate dielectric overlying the high-voltage logic sub-region.

4. The method according to claim 3, wherein the low-voltage gate dielectric precursor layer comprises a high κ dielectric liner stacked on a silicon dioxide layer.

5. The method according to claim 3, further comprising:
   forming and patterning a conductive layer overlying the low-voltage logic sub-region and the high-voltage logic sub-region to respectively form a high-voltage logic gate electrode on the high-voltage logic gate dielectric and a low-voltage logic gate electrode on the low-voltage logic gate dielectric.

6. The method according to claim 5, further comprising:
forming a memory cell structure on a memory region of the substrate, wherein the memory region is separated from the logic region by a boundary region defined therebetween; and
forming a dummy capping layer covering the memory cell structure;
wherein the stack of gate dielectric precursor layers is formed on the dummy capping layer after the forming of the dummy capping layer.

7. The method according to claim 6, further comprising:
removing the dummy capping layer from the memory region;
forming source/drain regions on opposite sides of the memory cell structure and within the memory region, and further on opposite sides of the high-voltage logic gate electrode and the low-voltage logic gate electrode and within the logic region;
forming a contact etch stop layer (CESL) along an outline of the memory cell structure and the logic devices; and
forming a lower inter-layer dielectric layer between and over the memory cell structure and the logic devices.

8. The method according to claim 5, further comprising:
replacing the high-voltage logic gate electrode or the low-voltage logic gate electrode with a metal gate electrode.

9. The method according to claim 7, further comprising:
forming an upper inter-layer dielectric layer over the lower inter-layer dielectric layer; and
forming contacts extending through the upper inter-layer dielectric layer and the lower inter-layer dielectric layer respectively to the source/drain regions in the memory region and the logic region.

10. The method according to claim 6, wherein forming the memory cell structure comprises:
forming a pair of floating gate electrodes on the substrate;
forming a pair of control gate electrodes respectively on the floating gate electrodes; and
forming a pair of select gate electrodes laterally alongside the floating gate electrodes and the control gate electrodes.

11. A method for forming an integrated circuit (IC), the method comprising:
providing a substrate comprising a logic region and a memory region separated by a boundary region, wherein the logic region comprises a first logic sub-region, a second logic sub-region, a third logic sub-region, a fourth logic sub-region, and a fifth logic sub-region;
forming a first gate dielectric precursor layer on the substrate and covering the first, second, third, fourth, and fifth logic sub-regions;
selectively removing the first gate dielectric precursor layer from the second logic sub-region without removing the first gate dielectric precursor layer from the first, third, fourth, and fifth logic sub-regions;
forming a second gate dielectric precursor layer on the first gate dielectric precursor layer and the substrate, and further covering the first, second, third, fourth, and fifth logic sub-regions;
selectively removing the first and second gate dielectric precursor layers from the third logic sub-region;

forming a third gate dielectric precursor layer on the second gate dielectric precursor layer and the substrate, and further covering the first, second, third, fourth, and fifth logic sub-regions;
selectively removing the first, second, and third gate dielectric precursor layers from the fourth and fifth logic sub-regions;
forming a fourth gate dielectric precursor layer on the third gate dielectric precursor layer and the substrate, and further covering the first, second, third, fourth, and fifth logic sub-regions; and
selectively removing the fourth gate dielectric precursor layer from the fifth logic sub-region.

12. The method according to claim 11, further comprising:
forming a fifth gate dielectric precursor layer on the fourth gate dielectric precursor layer at the first, second, third, and fourth logic sub-regions, and further on the substrate at the fifth logic sub-region;
forming a logic gate layer on the fifth gate dielectric precursor layer; and
performing an etch to the logic gate layer and the first, second, third, fourth, and fifth gate dielectric precursor layers to form first, second, third, fourth, and fifth logic gate electrodes and first, second, third, fourth, and fifth logic gate dielectrics correspondingly stacked on the first, second, third, fourth, and fifth logic sub-regions.

13. The method according to claim 12, further comprising:
forming a memory cell structure on the memory region of the substrate; and
forming a dummy capping layer covering the memory cell structure;
wherein the logic gate layer and the first, second, third, fourth, and fifth gate dielectric precursor layers are formed on the dummy capping layer after the forming of the dummy capping layer, and wherein the logic gate layer and the first, second, third, fourth, and fifth gate dielectric precursor layers are removed from the dummy capping layer when performing the etch to form the first, second, third, fourth, and fifth logic gate electrodes and the first, second, third, fourth, and fifth logic gate dielectrics.

14. The method according to claim 12, wherein the fifth gate dielectric precursor layer comprises a high κ dielectric liner stacked on a silicon dioxide layer.

15. The method according to claim 11, further comprising performing a plasma treatment process to the first, second, third, and fourth gate dielectric precursor layers prior to selectively removing the fourth gate dielectric precursor layer from the fifth logic sub-region.

16. The method according to claim 11, further comprising:
forming a plurality of deep trenches in a top surface of the substrate; and
filling the deep trenches with an isolation material to form a plurality of logic isolation structures between the first, second, third, fourth, and fifth logic sub-regions, wherein the filling is performed prior to forming the first gate dielectric precursor layer.

17. A method for forming an integrated circuit (IC), the method comprising:
forming a memory cell structure on a memory region of a substrate; and forming a plurality of logic devices on a logic region separated from the memory region by a boundary region, the formation of the plurality of logic devices comprising forming a first logic gate electrode separated from the substrate by a first logic gate dielectric for a first logic device configured to operate at a first voltage;

forming a second logic gate electrode separated from the substrate by a second logic gate dielectric for a second logic device configured to operate at a second voltage; and forming a third logic gate electrode separated from the substrate by a third logic gate dielectric for a third logic device configured to operate at a third voltage;

wherein the first, second, and third voltages monotonically decrease, and wherein thicknesses of the first, second, and third logic gate dielectrics monotonically decrease.

18. The method according to claim 17, further comprising:

forming a fourth logic gate electrode separated from the substrate by a fourth logic gate dielectric for a fourth logic device configured to operate at a fourth voltage; and forming a fifth logic gate electrode separated from the substrate by a fifth logic gate dielectric for a fifth logic device configured to operate at a fifth voltage;

wherein the first logic gate dielectric of the first logic device is formed by forming a first oxide layer on the substrate, a first portion of a second oxide layer on the first oxide layer, a first portion of a third oxide layer on the first portion of the second oxide layer, a first portion of a fourth oxide layer on the first portion of the third oxide layer, and a first portion of a fifth oxide layer on the first portion of the fourth oxide layer;

wherein the second logic gate dielectric of the second logic device is formed by forming a second portion of the second oxide layer on the substrate, a second portion of the third oxide layer on the second portion of the second oxide layer, a second portion of the fourth oxide layer on the second portion of the third oxide layer, and a second portion of the fifth oxide layer on the second portion of the fourth oxide layer;

wherein the third logic gate dielectric of the third logic device is formed by forming a third portion of the third oxide layer on the substrate, a third portion of the fourth oxide layer on the third portion of the third oxide layer, and a third portion of the fifth oxide layer on the third portion of the fourth oxide layer;

wherein the fourth logic gate dielectric of the fourth logic device is formed by forming a fourth portion of the fourth oxide layer on the substrate and a fourth portion of the fifth oxide layer on the fourth portion of the fourth oxide layer;

wherein the fifth logic gate dielectric of the fifth logic device is formed by forming a fifth portion of the fifth oxide layer on the substrate;

wherein the first, second, third, fourth, and fifth oxide layers respectively have uniform thicknesses.

19. The method according to claim 18, the formation of the memory cell structure comprising:

forming a pair of control gate electrodes respectively on a floating gate electrodes; and forming a pair of select gate electrodes laterally alongside the floating gate electrodes and the control gate electrodes;

wherein the first, second, third, fourth, and fifth logic gate electrode are made of metal; and wherein the pair of control gate electrodes and the pair of select gate electrodes are made of polysilicon.

20. The method according to claim 18, wherein the first, second, third, fourth, and fifth logic gate electrodes are made to have top surfaces aligned with each other, and further aligned with a top surface of a lower inter-layer dielectric (ILD) layer between the first, second, third, fourth, and fifth logic gate electrodes.

\* \* \* \* \*